US007010006B2

(12) United States Patent
Kasazumi et al.

(10) Patent No.: US 7,010,006 B2
(45) Date of Patent: Mar. 7, 2006

(54) LIGHT SOURCE APPARATUS AND ITS CONTROL METHOD

(75) Inventors: Ken'ichi Kasazumi, Takatsuki (JP); Yasuo Kitaoka, Ibaraki (JP); Tosifumi Yokoyama, Katano (JP); Kiminori Mizuuchi, Neyagawa (JP); Kazuhisa Yamamoto, Takatsuki (JP); Hisashi Senga, Neyagawa (JP); Shigeru Furumiya, Himeji (JP); Hiromichi Ishibashi, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 185 days.

(21) Appl. No.: 10/465,948

(22) PCT Filed: Jun. 21, 2002

(86) PCT No.: PCT/JP02/06204

§ 371 (c)(1),
(2), (4) Date: Jun. 26, 2003

(87) PCT Pub. No.: WO03/001635

PCT Pub. Date: Jan. 3, 2003

(65) Prior Publication Data

US 2004/0066807 A1    Apr. 8, 2004

(30) Foreign Application Priority Data

Jun. 22, 2001    (JP) .............................. 2001-189922

(51) Int. Cl.
*H01S 3/13* (2006.01)
*H01S 3/10* (2006.01)
(52) U.S. Cl. .................. 372/29.02; 372/22; 372/29.01
(58) Field of Classification Search ............ 372/21–22, 372/29.02
See application file for complete search history.

(56) References Cited

U.S. PATENT DOCUMENTS 4,821,273 A * 4/1989 Hori ............................ 372/31

(Continued)

FOREIGN PATENT DOCUMENTS

JP           4-13118           1/1992

(Continued)

OTHER PUBLICATIONS

Kazuhisa Yamamoto et al. "Optics Letters". *Optical Society of America*, vol. 16, No. 15, Aug. 1, 1991 pp. 1156-1158.

(Continued)

*Primary Examiner*—Minsun Oh Harvey
(74) *Attorney, Agent, or Firm*—Hamre, Schumann, Mueller & Larson, P.C.

(57) ABSTRACT

A light source device can attain a stable output of a harmonic even when there occurs a change in the ambient temperature or fluctuation in the output power. The light source device is provided with a semiconductor laser source (4), an optical waveguide-type QPM-SHG device (5) for generating a second harmonic from light emitted from the semiconductor laser source (4), a wavelength control means (7) for controlling a wavelength of light emitted from the semiconductor laser source (4), a means for slightly fluctuating wavelength (8) for changing a wavelength of light emitted from the semiconductor laser source (4) and a means for detecting a change in output light power of the optical waveguide-type QPM-SHG device (5) that occurs when a wavelength of light emitted from the semiconductor laser source (4) is changed. In this case, a wavelength of light emitted from the semiconductor laser source (4) is controlled to an optimum wavelength of the optical waveguide-type QPM-SHG device (5) based on a change in output light power of the optical waveguide-type QPM-SHG device (5) that occurs when a wavelength of light emitted from the semiconductor laser source (4) is changed.

15 Claims, 18 Drawing Sheets

U.S. PATENT DOCUMENTS

| | | | | |
|---|---|---|---|---|
| 5,835,650 A | * | 11/1998 | Kitaoka et al. | 385/49 |
| 5,960,259 A | * | 9/1999 | Kitaoka et al. | 438/106 |
| 6,067,393 A | * | 5/2000 | Kitaoka et al. | 385/49 |
| 6,069,904 A | * | 5/2000 | Kitaoka et al. | 372/32 |
| 6,130,901 A | * | 10/2000 | Takamine et al. | 372/32 |
| 6,298,075 B1 | * | 10/2001 | Kitaoka et al. | 372/33 |
| 6,477,188 B1 | * | 11/2002 | Takaoka et al. | 372/22 |
| 6,590,915 B1 | * | 7/2003 | Kitaoka et al. | 372/38.02 |
| 6,845,113 B1 | * | 1/2005 | Kitaoka et al. | 372/22 |

FOREIGN PATENT DOCUMENTS

| | | |
|---|---|---|
| JP | 5-323406 | 12/1993 |
| JP | 6-326392 | 11/1994 |
| JP | 11-026861 | 1/1999 |
| JP | 2000-219021 | 8/2000 |
| WO | WO 96/10855 | 4/1996 |

OTHER PUBLICATIONS

Toshifumi Yokoyama et al. "Power stabilizing method of the blue light source using quasi-phase-matched second harmonic generation". *T.IEE Japan*, vol. 120-C, No. 7, 2000, pp. 938-944.

* cited by examiner

LIGHT SOURCE APPARATUS AND ITS CONTROL METHOD

TECHNICAL FIELD

The present invention relates to light source devices and methods for controlling the same. More specifically, the present invention relates to a short-wavelength light source that includes a semiconductor laser device and a second harmonic generation device, as well as to the method for controlling the output light intensity of the same.

BACKGROUND ART

Compact short-wavelength light sources are required in order to achieve high density for optical disks and high resolution for displays. Coherent light sources using a semiconductor laser and a quasi phase matching (referred to as "QPM" in the following) optical waveguide-type second harmonic generation (referred to as "SHG" in the following) device (optical waveguide-type QPM-SHG device) have received attention as compact short-wavelength light sources (see Yamamoto et al., Optics Letters, Vol. 16, No. 15, 1156 (1991)).

FIG. 20 shows a diagram showing the configuration of an SHG blue light source using an optical waveguide-type QPM-SHG device. As shown in FIG. 20, a wavelength-variable distributed Bragg reflector (referred to as "DBR" in the following) semiconductor laser 54 having a DBR region is used as the semiconductor laser. The wavelength-variable DBR semiconductor laser 54 is a 0.85 μm band 100 mW level AlGaAs wavelength-variable DBR semiconductor laser, and includes an active layer region 56, a phase adjustment region 57 and a DBR region 58. The oscillation wavelength can be changed continuously by controlling the currents injected into the phase adjustment region 57 and the DBR region 58 at a constant ratio.

The optical waveguide-type QPM-SHG device 55 serving as the second harmonic generation device is made of an optical waveguide 60 and periodic polarity inversion regions 61 formed on an X-cut MgO-doped LiNbO$_3$ substrate 59. The optical waveguide 60 is formed by proton exchange in pyrophosphoric acid. Moreover, the periodic polarity inversion regions 61 are fabricated by forming a comb-shaped electrode on the X-cut MgO-doped LiNbO$_3$ substrate 59 and applying an electric field.

In the SHG blue light source shown in FIG. 20, 75 mW of laser light are coupled into the optical waveguide 60 for 100 mW of the laser output. By controlling the amounts of current injected into the phase adjustment region 57 and the DBR region 58 of the wavelength-variable DBR semiconductor laser 54, the oscillation wavelength is fixed within the phase matching wavelength tolerance width of the optical waveguide-type QPM-SHG device 55. The use of this SHG blue light source provides about 25 mW of blue light of 425 nm wavelength, and the obtained blue light, when lateral mode is the TE$_{00}$ mode, has focusing property of the diffraction limit and also low noise performance with a relative noise field intensity of −140 dB/Hz or less, which are characteristics suitable for reproducing optical disks.

When the optical waveguide-type QPM-SHG device serving as the second harmonic generation device is evaluated for the output characteristics of blue light with respect to the wavelength of the fundamental wave, it can be seen that its wavelength width at which the output of blue light is half (wavelength tolerance width for phase matching) is as small as about 0.1 nm. This presents a significant problem in obtaining a stable output of blue light. In order to solve this problem, conventionally, the wavelength-variable DBR semiconductor laser is used as the fundamental wave and the wavelength (oscillation wavelength) of the fundamental wave is fixed within the phase matching wavelength tolerance width of the optical waveguide-type QPM-SHG device, thereby realizing a stable output of blue light.

Ordinarily, the oscillation wavelength of the semiconductor laser source changes with the ambient temperature, and the optimum wavelength of the optical waveguide-type QPM-SHG device also changes with the ambient temperature. Therefore, conventionally, the temperatures of the semiconductor laser source and the optical waveguide-type QPM-SHG device are maintained constant by using a Peltier device or the like, thereby stabilizing the output of blue light.

However, when considering the installation in optical information processing equipment, such as optical disk devices and laser printers, the average output power changes every instant during operation. In this case, even when the ambient temperature is maintained constant by using a Peltier device or the like, the amount of heat generated by the semiconductor laser source changes, so that the temperature of the semiconductor laser source itself changes and hence the oscillation wavelength changes, making it impossible to obtain a stable output of blue light.

Moreover, in the case of omitting the use of a temperature control device such as a Peltier device for the purpose of downsizing the device, the fluctuation in the ambient temperature further increases, leading to a change in the output of the optical waveguide-type QPM-SHG device.

DISCLOSURE OF INVENTION

The present invention was achieved in order to solve the foregoing problems in the prior art, and it is an object of the present invention to provide a light source device that includes a semiconductor laser source and a second harmonic generation device and that can attain a stable output of a harmonic even when there occurs a change in the ambient temperature or fluctuation in the output power. Moreover, it is another object of the present invention to provide a control method that can realize such a light source device.

In order to achieve the above-described objects, a first configuration of a light source device in accordance with the present invention includes: a semiconductor laser source; a second harmonic generation device for generating a second harmonic from light emitted from the semiconductor laser source; a means for controlling a wavelength of light emitted from the semiconductor laser source; a means for changing a wavelength of light emitted from the semiconductor laser source; and a means for detecting a change in output light power of the second harmonic generation device that occurs when the wavelength of light emitted from the semiconductor laser source is changed, wherein the wavelength of light emitted from the semiconductor laser source is controlled to an optimum wavelength of the second harmonic generation device based on the change in output light power of the second harmonic generation device that occurs when the wavelength of light emitted from the semiconductor laser source is changed.

A second configuration of a light source device in accordance with the present invention includes: a semiconductor laser source; a second harmonic generation device for generating a second harmonic from light emitted from the semiconductor laser source; a means for controlling an optimum wavelength of the second harmonic generation device; a means for changing a wavelength of light emitted from the semiconductor laser source; and a means for detecting a change in output light power of the second harmonic generation device that occurs when the wavelength of light emitted from the semiconductor laser source is changed, wherein a wavelength of the second harmonic generation device is controlled to the optimum wavelength based on the change in output light power of the second harmonic generation device that occurs when the wavelength of light emitted from the semiconductor laser source is changed.

A third configuration of a light source device in accordance with the present invention includes: a semiconductor laser source; a second harmonic generation device for generating a second harmonic from light emitted from the semiconductor laser source; a means for controlling output light power of the semiconductor laser source in such a manner that a power of the second harmonic emitted from the second harmonic generation device is constant; a means for controlling a wavelength of light emitted from the semiconductor laser source; a means for changing the wavelength of light emitted from the semiconductor laser source; and a means for detecting a change in output light power of the semiconductor laser source or a change in an amount of a current injected into the semiconductor laser source that occurs when the wavelength of light emitted from the semiconductor laser source is changed, wherein the wavelength of light emitted from the semiconductor laser source is controlled to an optimum wavelength of the second harmonic generation device based on the change in output light power of the semiconductor laser source or the change in the amount of the current injected into the semiconductor laser source that occurs when the wavelength of light emitted from the semiconductor laser source is changed.

A fourth configuration of a light source device in accordance with the present invention includes: a semiconductor laser source; a second harmonic generation device for generating a second harmonic from light emitted from the semiconductor laser source; a means for controlling output light power of the semiconductor laser source in such a manner that a power of the second harmonic emitted from the second harmonic generation device is constant; a means for controlling an optimum wavelength of the second harmonic generation device; a means for changing a wavelength of light emitted from the semiconductor laser source; and a means for detecting a change in output light power of the semiconductor laser source or a change in an amount of a current injected into the semiconductor laser source that occurs when the wavelength of light emitted from the semiconductor laser source is changed, wherein a wavelength of the second harmonic generation device is controlled to the optimum wavelength based on the change in output light power of the semiconductor laser source or the change in the amount of the current injected into the semiconductor laser source that occurs when the wavelength of the semiconductor laser source is changed.

A first method for controlling a light source device in accordance with the present invention is a method for controlling a light source device including a semiconductor laser source and a second harmonic generation device for generating a second harmonic from light emitted from the semiconductor laser source, the method including: using at least a means for controlling a wavelength of light emitted from the semiconductor laser source, a means for changing the wavelength of light emitted from the semiconductor laser source and a means for detecting a change in output light power of the second harmonic generation device that occurs when the wavelength of light emitted from the semiconductor laser source is changed; and controlling the wavelength of light emitted from the semiconductor laser source to an optimum wavelength of the second harmonic generation device based on the change in output light power of the second harmonic generation device that occurs when the wavelength of light emitted from the semiconductor laser source is changed.

A second method for controlling a light source device in accordance with the present invention is a method for controlling a light source device including a semiconductor laser source and a second harmonic generation device for generating a second harmonic from light emitted from the semiconductor laser source, the method including: using at least a means for controlling an optimum wavelength of the second harmonic generation device, a means for changing a wavelength of light emitted from the semiconductor laser source, a means for detecting a change in output light power of the second harmonic generation device that occurs when the wavelength of light emitted from the semiconductor laser source is changed; and controlling a wavelength of the second harmonic generation device to the optimum wavelength based on the change in output light power of the second harmonic generation device that occurs when the wavelength of light emitted from the semiconductor laser source is changed.

A third method for controlling a light source device in accordance with the present invention is a method for controlling a light source device including a semiconductor laser source and a second harmonic generation device for generating a second harmonic from light emitted from the semiconductor laser source, the method including: using at least a means for controlling output light power of the semiconductor laser source in such a manner that a power of the second harmonic emitted from the second harmonic generation device is constant, a means for controlling a wavelength of light emitted from the semiconductor laser source, a means for changing the wavelength of light emitted from the semiconductor laser source and a means for detecting a change in output light power of the semiconductor laser source or a change in an amount of a current injected into the semiconductor laser source that occurs when the wavelength of light emitted from the semiconductor laser source is changed; and controlling the wavelength of the semiconductor laser source to an optimum wavelength of the second harmonic generation device based on the change in output light power of the semiconductor laser source or the change in the amount of the current injected into the semiconductor laser source that occurs when the wavelength of the semiconductor laser source is changed.

A fourth method for controlling a light source device in accordance with the present invention is a method for controlling a light source device including a semiconductor laser source and a second harmonic generation device for generating a second harmonic from light emitted from the semiconductor laser source, the method including: using at least a means for controlling output light power of the semiconductor laser source in such a manner that a power of the second harmonic emitted from the second harmonic generation device is constant, a means for controlling an optimum wavelength of the second harmonic generation device, a means for changing a wavelength of light emitted from the semiconductor laser source and a means for detecting a change in output light power of the semiconductor laser source or a change in an amount of a current injected into the semiconductor laser source that occurs when the wavelength of light emitted from the semiconductor laser source is changed; and controlling a wavelength of the second harmonic generation device to the optimum wavelength based on the change in output light power of the semiconductor laser source or the change in the amount of the current injected into the semiconductor laser source that occurs when the wavelength of light emitted from the semiconductor laser source is changed.

A fifth configuration of a light source device in accordance with the present invention includes: a semiconductor laser source including at least an active layer region and a phase adjustment region; a means for injecting into the phase adjustment region a current that is in anti-phase with a current injected into the active layer region when modulation is performed by switching an average output power of the semiconductor laser source between at least two values corresponding to a low output and a high output, respectively; and a means for asymptotically changing a current injected into the phase adjustment region after the switching, starting immediately after the switching.

A sixth configuration of a light source device in accordance with the present invention includes: a semiconductor laser source including at least an active layer region, a phase adjustment region and a distributed Bragg reflector (DBR) region; a means for injecting into the phase adjustment region and the DBR region a current that is in anti-phase with a current injected into the active layer region when modulation is performed by switching an average output power of the semiconductor laser source between at least two values corresponding to a low output and a high output, respectively; and a means for asymptotically changing the current injected into the phase adjustment region and the DBR region after the switching, starting immediately after the switching.

A seventh configuration of a light source device in accordance with the present invention includes a semiconductor laser source including at least an active layer region and a phase adjustment region; and a means for driving the phase adjustment region, using a signal obtained by passing through a filter a drive signal of the active layer region when modulation is performed by switching an average output power of the semiconductor laser source between at least two values corresponding to a low output and a high output, respectively.

An eighth configuration of a light source device in accordance with the present invention includes a semiconductor laser source including at least an active layer region and a phase adjustment region; a second harmonic generation device for generating a second harmonic from light emitted from the semiconductor laser source; a means for injecting into the phase adjustment region a current that is in anti-phase with a current injected into the active layer region when modulation is performed by switching an average output power of the semiconductor laser source between at least two values corresponding to a low output and a high output, respectively; and a means for controlling the current injected into the active layer region in such a manner that a power of the second harmonic generated in the second harmonic generation device becomes constant after the switching.

A ninth configuration of a light source device in accordance with the present invention includes a semiconductor laser source including at least an active layer region and a phase adjustment region; a second harmonic generation device for generating a second harmonic from light emitted from the semiconductor laser source; a means for injecting into the phase adjustment region a current that is in anti-phase with a current injected into the active layer region when modulation is performed by switching an average output power of the semiconductor laser source between at least two values corresponding to a low output and a high output, respectively; and a means for controlling the current injected into the active layer region and the phase control region in such a manner that a power of the second harmonic generated in the second harmonic generation device becomes constant after the switching.

A configuration of an optical information recording/reproducing apparatus in accordance with the present invention includes: the above-described light source device; a condensing optical system for guiding light from the light source device to an information carrier; and a means for detecting light reflected from the information carrier.

BEST MODE FOR CARRYING OUT THE INVENTION

In the following, the present invention will be described more specifically with reference to embodiments.

First Embodiment

Figure 1:
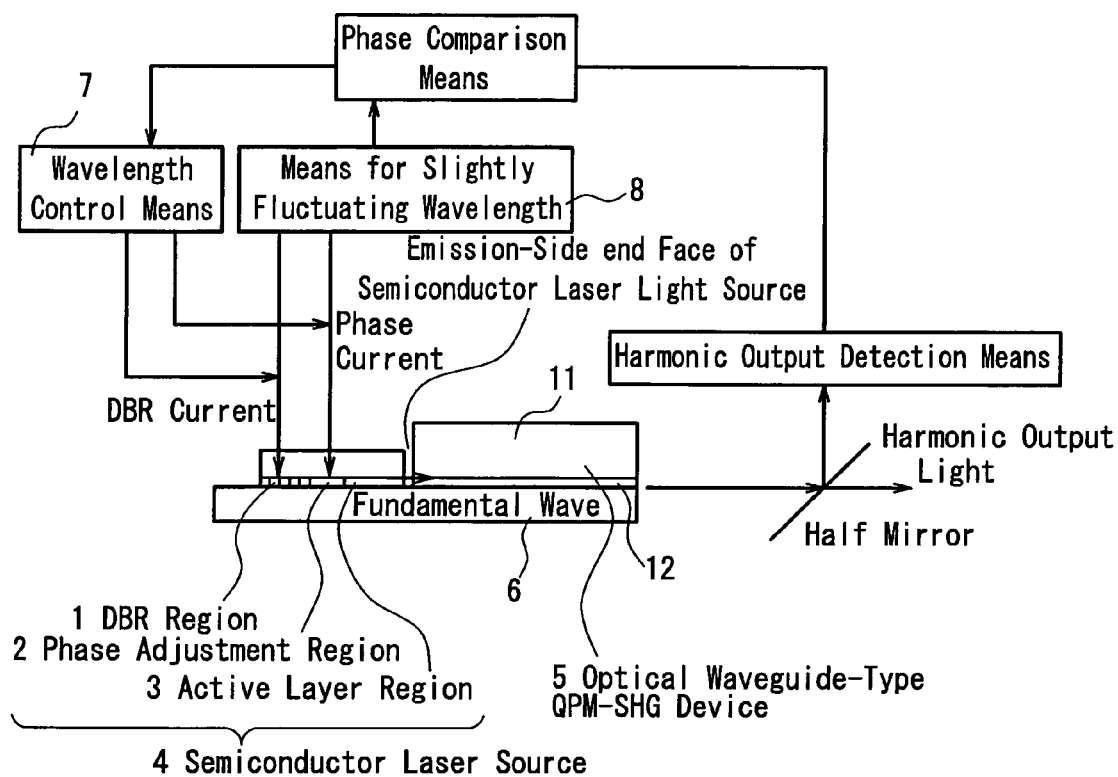
FIG. 1 is a diagram showing the configuration of a light source device according to a first embodiment of the present invention.

FIG. 1 is a diagram showing the configuration of a light source device according to a first embodiment of the present invention.

As shown in FIG. 1, in the light source device of this embodiment, a 0.85 µm band 100 mW level AlGaAs wavelength-variable distributed Bragg reflector (referred to as "DBR" in the following) semiconductor laser source 4 that includes a DBR region 1, a phase adjustment region 2 for adjusting the phase of light in the laser with an injection current and an active layer region 3 for controlling the output power with an injection current, is used as the semiconductor laser source used for a fundamental wave.

Moreover, a quasi phase matching (referred to as "QPM" in the following) optical waveguide-type second harmonic generation (referred to as "SHG" in the following) device (optical waveguide-type QPM-SHG device) 5 is used as a second harmonic generation device. More specifically, the optical waveguide-type QPM-SHG device 5 is made of an optical waveguide 12 and periodic polarity inversion regions that are arranged perpendicular to the optical waveguide 12 for compensating the propagation constant difference between the fundamental wave and harmonics, formed on the upper surface of an optical crystal substrate (0.5 mm thick X-cut MgO-doped LiNbO$_3$ substrate) 11 using lithium niobate (LiNbO$_3$). The optical waveguide 12 is formed by proton exchange in pyrophosphoric acid. Moreover, the periodic polarity inversion regions are fabricated by forming a comb-shaped electrode on the X-cut MgO-doped LiNbO$_3$ substrate 11 and applying an electric field. With the optical waveguide-type QPM-SHG device 5, it is possible to realize a high conversion efficiency, because it is possible to utilize its large nonlinear optical constants, and also because it is of the optical waveguide type and a long interaction length can be established.

The semiconductor laser source 4 and the optical waveguide-type QPM-SHG device 5 are integrated on a Si submount 6, and their temperature is controlled with a Peltier device. The semiconductor laser light serving as the fundamental wave is coupled into the optical waveguide of the optical waveguide-type QPM-SHG device 5 by direct coupling, without using a lens. That is, a fundamental wave emitted from the semiconductor laser source 4 is made incident on the optical waveguide-type QPM-SHG device 5, and the fundamental wave incident on the optical waveguide-type QPM-SHG device 5 is trapped inside the optical waveguide 12 and propagates therethrough. The fundamental wave propagating through the optical waveguide 12 is converted into a second harmonic by the nonlinearity of the optical crystal (X-cut MgO-doped LiNbO$_3$), and a harmonic whose wavelength is one half that of the fundamental wave is emitted from the emission-side end face of the optical waveguide-type QPM-SHG device 5.

Figure 2A:
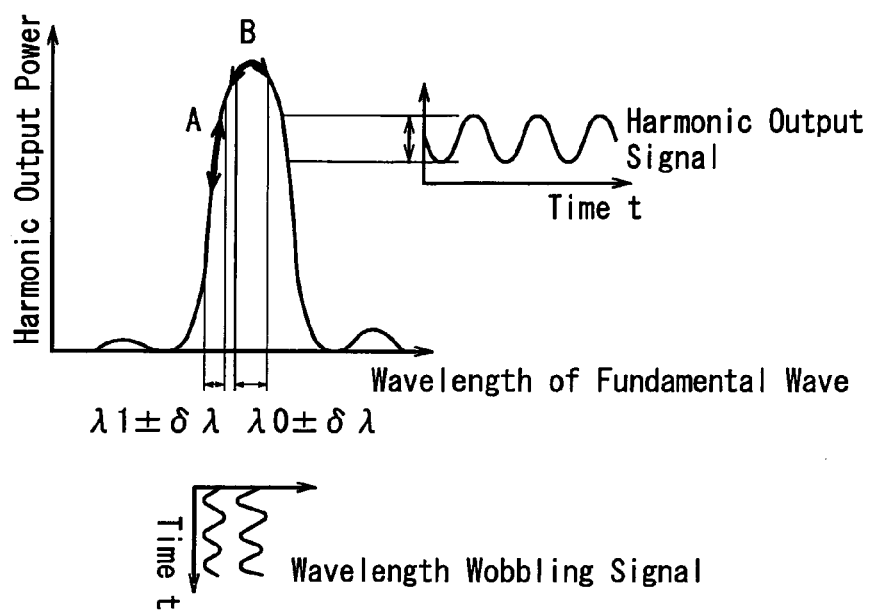
FIG. 2A is a graph showing the output power of an emitted harmonic with respect to the wavelength of a fundamental wave in the first embodiment.

Due to the chromatic dispersion of the optical crystal (X-cut MgO-doped LiNbO$_3$), the optical waveguide-type QPM-SHG device (also referred to as "SHG device" in the following) 5 having the above-described configuration has wavelength characteristics as shown in FIG. 2A with respect to the wavelength of the incident fundamental wave. FIG. 2A shows the output power of the emitted harmonic with respect to the wavelength of the incident fundamental wave. The harmonic exhibits the output characteristics expressed by a SINC function as shown in the following Equation 1 with respect to the wavelength λ of the fundamental wave, taking the optimum wavelength λ0 of the fundamental wave as the peak.

$$y = \text{Sinc}\{(\lambda - \lambda 0) \times \pi/a\} \quad \text{(Equation 1)}$$
$$= \sin\{(\lambda - \lambda 0) \times \pi/a\}/\{(\lambda - \lambda 0) \times \pi/a\}$$

Here, the wavelength tolerance, which is represented by the wavelength width at which the output power of the harmonic is one half the maximum value, Ė0.1 nm, and it is necessary that the wavelength of the fundamental wave be precisely and stably controlled at λ0 in order to obtain a stable output of blue light.

The following describes a method for controlling the oscillation wavelength of the semiconductor laser source 4 shown in FIG. 1.

Ordinarily, in a semiconductor laser source, only light with the wavelength λ that satisfies the following Equation 2 with respect to the optical distance L between the front and rear reflection planes is excited.

$$2L = n\lambda (n: \text{integer}) \quad \text{(Equation 2)}$$

A set of the wavelengths λ that satisfy the above Equation 2 is called a "longitudinal mode", in which case the oscillation wavelengths take on discrete values. In the semiconductor laser source 4 shown in FIG. 1, a phase adjustment region 2 is provided between a DBR region 1 and the emission-side end face of the semiconductor laser source 4, and the wavelength λ of the longitudinal mode can be changed by altering the optical distance L of the semiconductor laser source 4 with the current applied to the phase adjustment region 2. Thus, it is possible to control the oscillation wavelength of the semiconductor laser source 4 with the current applied to the phase adjustment region 2.

In this wavelength control method, however, the wavelength control range is limited for the reason described below. That is, a grating is formed in the DBR region 1 of the semiconductor laser source 4 shown in FIG. 1, and only a light with a wavelength defined by the period of the grating is reflected. Specifically, when the refractive index of the DBR region 1 is $n_{dbr}$ and the grating period of the DBR region 1 is Λ, the range of the wavelengths that can be reflected in the DBR region 1 is about $2Λ/n_{dbr}±0.1$ nm, so that the wavelength control can be performed only in this range.

In this embodiment, the following method is adopted in order to broaden the above-described wavelength control range. That is, an electrode is formed in the DBR region 1, and the current applied to this electrode changes the effective grating period of the DBR region 1 and also the optimum wavelength in the DBR region 1. By changing the optimum wavelength in the DBR region 1 in accordance with the change in the wavelength of the longitudinal mode caused by the current applied to the phase adjustment region 2, it is possible to control the oscillation wavelength continuously. In practice, currents with a constant ratio are applied to the DBR region 1 and the phase adjustment region 2.

Next, a method for stabilizing the output of a light source of the present invention is described with reference to FIG. 1.

Figure 2B:
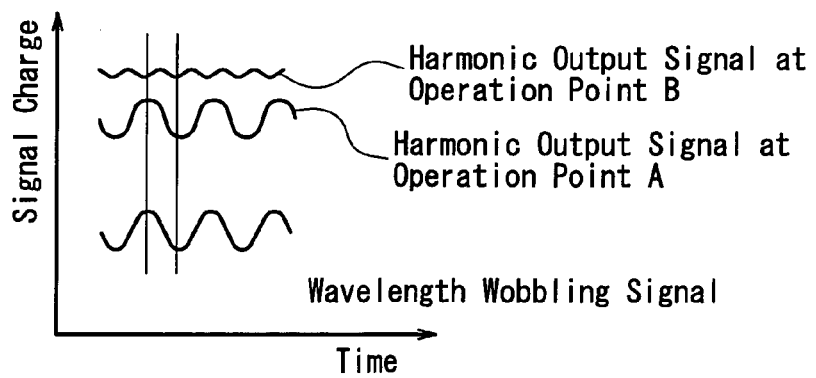
FIG. 2B is a graph showing how the output power of blue light fluctuates in the same embodiment.

In FIG. 1, numeral 7 denotes a wavelength control means, and the wavelength control means 7 controls the oscillation wavelength of the semiconductor laser source 4 to a certain wavelength by controlling the currents applied to the DBR region 1 and the phase adjustment region 2. At that time, currents with a constant ratio are applied to the DBR region 1 and the phase adjustment region 2 of the semiconductor laser source 4 with a means for periodically changing the wavelength of light emitted from the semiconductor laser source 8, thereby slightly changing the oscillation wavelength of the semiconductor laser source 4. A portion, for example, about 5% of the harmonic output light at this time is separated with a half mirror, and its change over time is monitored with a harmonic output detection means. FIG. 2B shows how the output power of blue light fluctuates at that time.

If the oscillation wavelength of the semiconductor laser source 4 is controlled in the vicinity of the optimum wavelength λ0 of the optical waveguide-type QPM-SHG device 5, the wavelength changes with the operation point B as the center, and the harmonic output light is modulated with a period twice that of the wavelength fluctuation signal of the semiconductor laser source 4. At this time, regarding the slight fluctuation in the wavelength, the output of the harmonic when the wavelength is fluctuated to the shorter wavelength side is equal to that when the wavelength is fluctuated to the longer wavelength side.

In contrast, if the oscillation wavelength of the semiconductor laser source 4 is shifted from the optimum wavelength λ0 of the optical waveguide-type QPM-SHG device 5 owing to a change in the ambient temperature of a change in the drive current of the semiconductor laser source 4, the operation takes place, for example, with the operation point A as the center. FIG. 2B shows a case (the operation point A) in which the oscillation wavelength of the semiconductor laser source 4 is shifted to a wavelength shorter than the optimum wavelength λ0 of the optical waveguide-type QPM-SHG device 5. The harmonic output light at this time shows an output fluctuation having the same period as the wavelength fluctuation, and the output of the harmonic is larger when the wavelength is long, whereas it is smaller when the wavelength is short. In this way, the phase of a wavelength wobbling signal generated with the means for periodically changing the wavelength of light emitted from the semiconductor laser source 8 should be compared wit the phase of the output signal from the harmonic output detection means a phase comparison means, and when they are in phase as shown in FIG. 2B, the wavelength should be controlled to be longer. Although not shown, if the oscillation wavelength of the semiconductor laser source 4 is shifted to a wavelength longer than the optimum wavelength λ0 of the optical waveguide-type QPM-SHG device 5, the output of the harmonic is smaller when the wavelength is long, whereas it is larger when the wavelength is short.

As described above, by monitoring the output power of the harmonic when the oscillation wavelength of the semiconductor laser source 4 is slightly changed, it is possible to detect any shift from the optimum wavelength λ0 of the optical waveguide-type QPM-SHG device 5. Then, feeding back this wavelength shift to the oscillation wavelength of the semiconductor laser source 4 makes it possible to control the oscillation wavelength of the semiconductor laser source 4 continually to the optimum wavelength λ0 of the optical waveguide-type QPM-SHG device 5 and continually to maintain a constant and maximum conversion efficiency in the optical waveguide-type QPM-SHG device 5 with respect to a constant output of the fundamental wave, thereby stabilizing the output of the harmonic.

Second Embodiment

Figure 3:
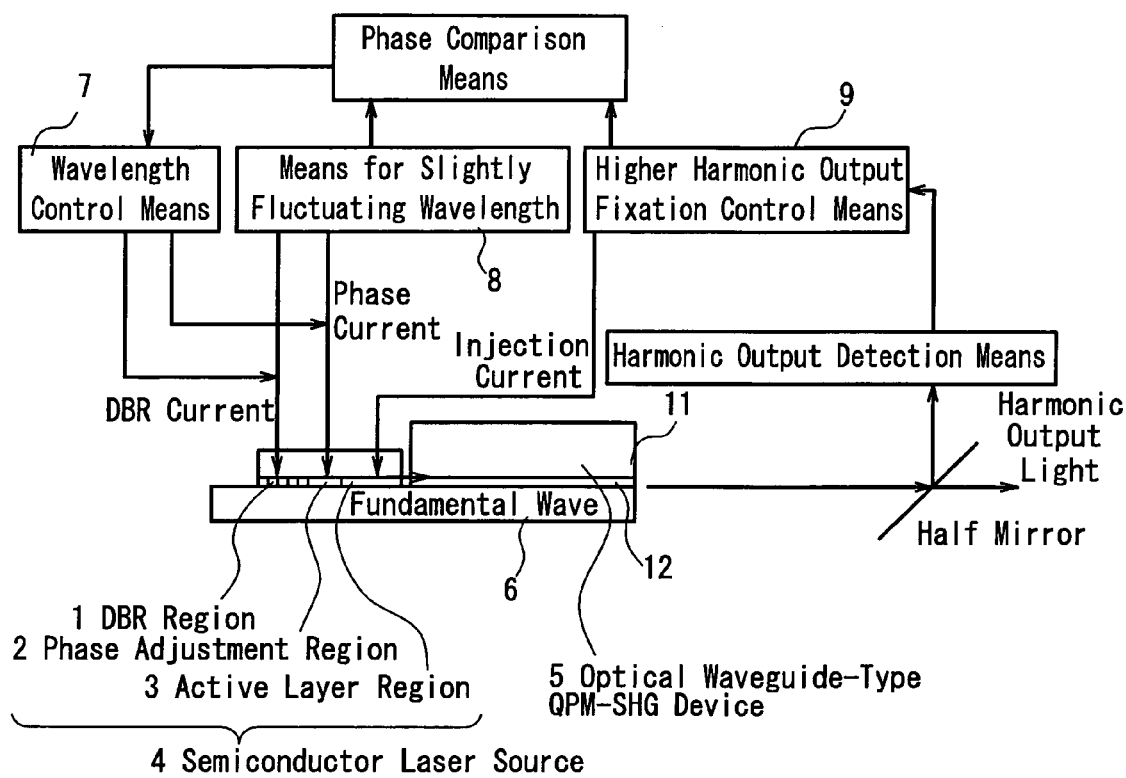
FIG. 3 is a diagram showing the configuration of a light source device according to a second embodiment of the present invention.

In the wavelength control method described in the first embodiment, the output power of the harmonic, although slightly, is changed in order to monitor the output power of the harmonic. In this embodiment, a method for controlling the output power of the harmonic with higher precision is described. FIG. 3 is a diagram showing the configuration of a light source device according to a second embodiment of the present invention.

As shown in FIG. 3, in this embodiment, a harmonic output fixation control means 9 is used in addition to the configuration shown in FIG. 1. More specifically, when slightly fluctuating the oscillation wavelength of the semiconductor laser source 4 with the means for periodically changing the wavelength of light emitted from the semiconductor laser source 8, the output of the harmonic is monitored and fed back, with the harmonic output fixation control means 9, to the current injected into the active layer region 3 of the semiconductor laser source 4. If the output of the harmonic decreases, the current injected into the active layer region 3 of the semiconductor laser source 4 is increased so as to increase the output of the fundamental wave, thereby maintaining the output of the harmonic constant. By setting the response frequency of this feedback loop sufficiently higher than the fluctuation frequency of the means for periodically changing the wavelength of light emitted from the semiconductor laser source 8, the fluctuation amount of the output of the harmonic can be suppressed to be sufficiently low, even when the wavelength is fluctuated.

In this case, shifts of the oscillation wavelength of the semiconductor laser source 4 from the optimum wavelength of the optical waveguide-type QPM-SHG device 5 are detected by monitoring the correlation between the signal of the means for periodically changing the wavelength of light emitted from the semiconductor laser source 8 and the change of the amount of injection current over time.

Figure 4A:
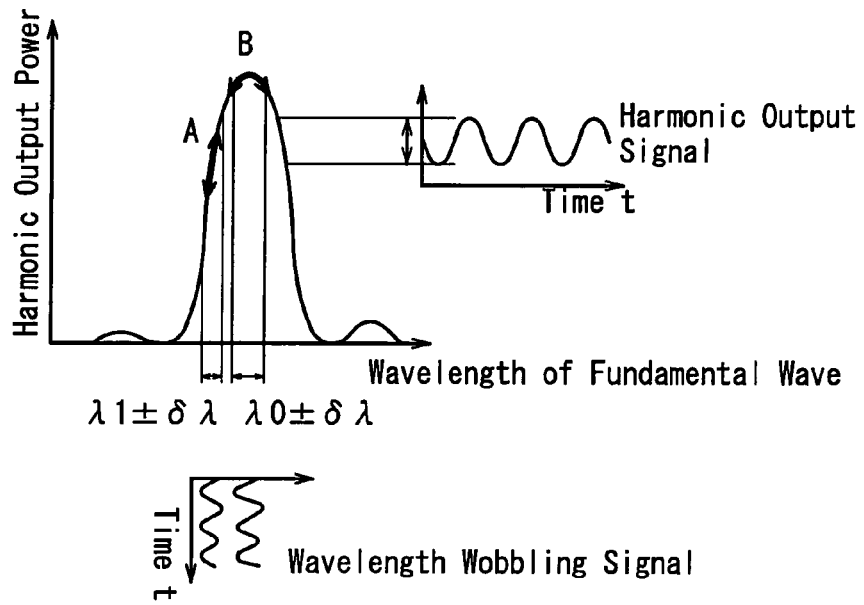
FIG. 4A is a graph showing the output power of an emitted harmonic with respect to the wavelength of a fundamental wave in the second embodiment.
Figure 4B:
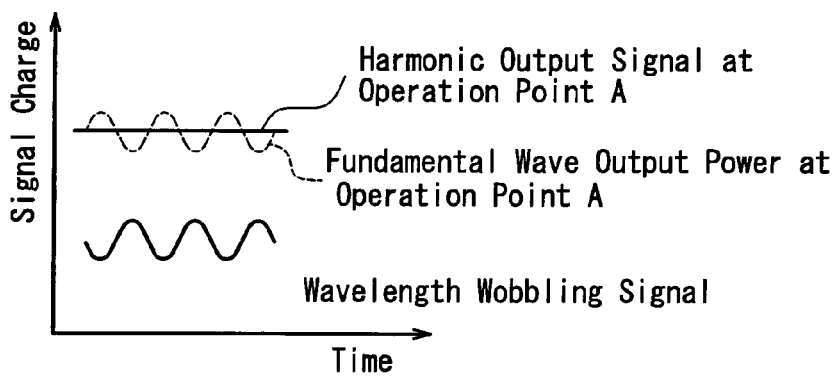
FIG. 4B is a graph showing the relation between the change of the amount of injection current over time and the slight fluctuation in the wavelength in the same embodiment.

FIG. 4B shows the relation between the change of the amount of injection current over time and the slight fluctuation in the wavelength. For example, a signal change is described for the case (the operation point A in FIG. 4A) that the oscillation wavelength of the semiconductor laser source 4 is shifted to a wavelength shorter than the optimum wavelength λ0 of the optical waveguide-type QPM-SHG device 5. When the oscillation wavelength of the semiconductor laser source 4 is made shorter with the means for periodically changing the wavelength of light emitted from the semiconductor laser source 8, the conversion efficiency in the optical waveguide-type QPM-SHG device 5 decreases. In this case, however, the current injected into the active layer region 3 of the semiconductor laser source 4 is increased with the harmonic output fixation control means 9 so as to increase the output of the fundamental wave, thereby keeping the output of the harmonic constant. Conversely, when the oscillation wavelength of the semiconductor laser source 4 is made longer with the means for periodically changing the wavelength of light emitted from the semiconductor laser soure 8, the current injected into the active layer region 3 of the semiconductor laser source 4 is decreased with the harmonic output fixation control means 9. Thus, the oscillation wavelength of the semiconductor laser source 4 is gradually changed to the longer wavelength side when the change in the injection current is in anti-phase with respect to the signal of the wavelength fluctuation, whereas, conversely, the oscillation wavelength of the semiconductor laser source 4 is gradually changed to the shorter wavelength side when the change in the injection current is in phase with respect to the signal of the wavelength fluctuation, thereby making it possible to control the oscillation wavelength of the semiconductor laser source 4 to the optimum wavelength of the optical waveguide-type QPM-SHG device 5 and thus stabilizing the output power of the harmonic.

As described above, in combination with the control in which the optimum wavelength is sought by slightly fluctuating the oscillation wavelength of the semiconductor laser source 4 with the means for periodically changing the wavelength of light emitted from the semiconductor laser source 8, the fixation control of the output of the harmonic is performed and increases and decreases of the current injected into the active layer region 3 of the semiconductor laser source 4 are detected, thereby making it possible to suppress the fluctuation in the output of the harmonic.

Figure 5:
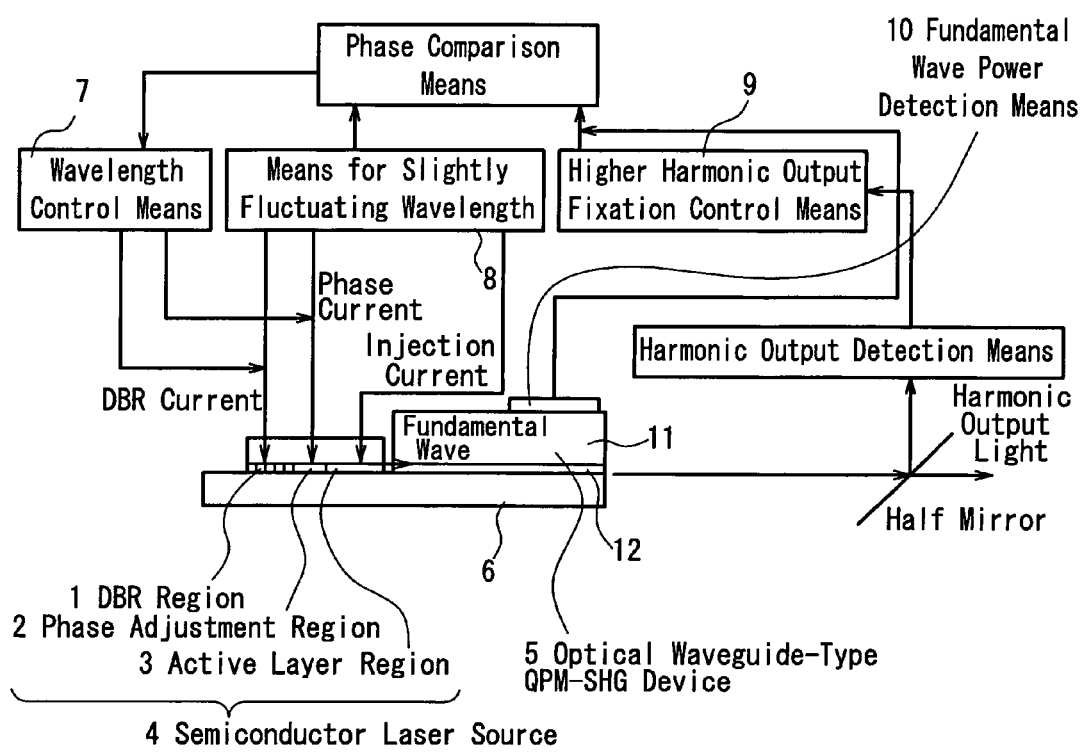
FIG. 5 is a diagram showing the configuration of another example of a light source device according to the second embodiment of the present invention.

Moreover, a similar effect also can be obtained by detecting any wavelength shift based on the change of the power of the fundamental wave over time, instead of detecting an increase and decrease of the current injected into the active layer region 3 of the semiconductor laser source 4. In this case, unlike monitoring the amount of a current injected into the active layer region 3 of the semiconductor laser source 4, no effect is exerted by the change in the emission efficiency of the semiconductor laser source 4, so that a more precise wavelength control is possible. This control method can be achieved, as shown in FIG. 5, by arranging a fundamental wave power detection means 10 on the optical crystal substrate (X-cut MgO-doped LiNbO$_3$ substrate) 11 that is a part of the optical waveguide-type QPM-SHG device 5 and detecting any light that has not been coupled into the optical waveguide-type QPM-SHG device 5, out of light emitted from the semiconductor laser source 4.

Third Embodiment

Figure 6:
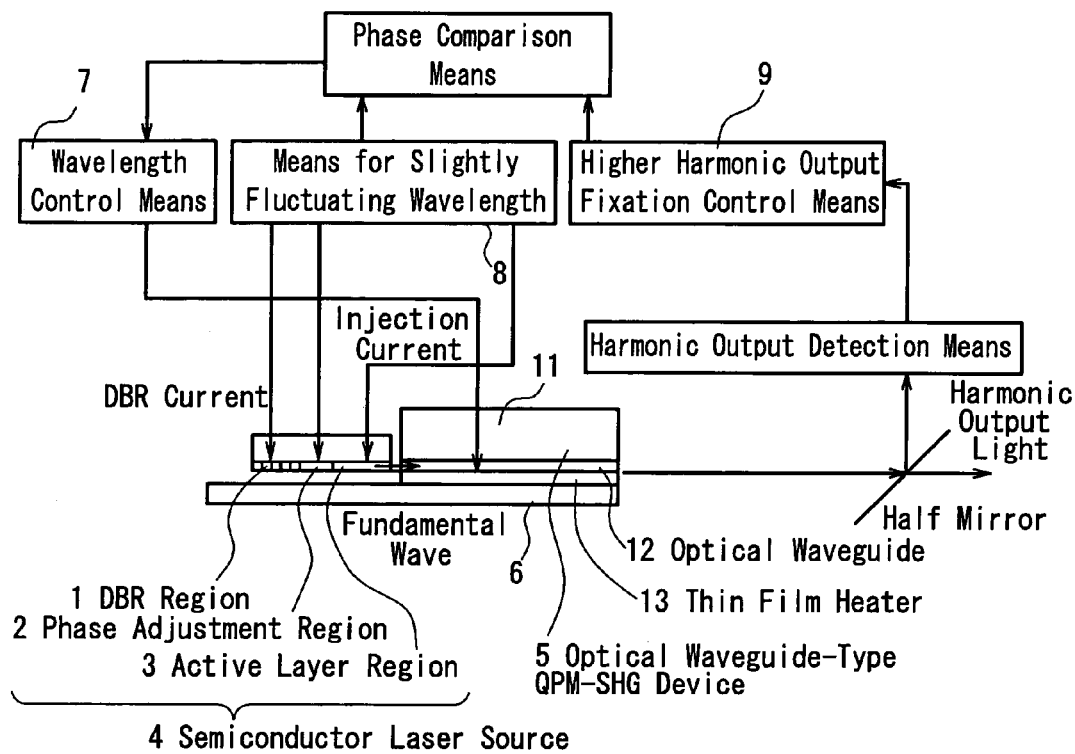
FIG. 6 is a diagram showing the configuration of a light source device according to a third embodiment of the present invention.

The first and second embodiments described light source devices for controlling the oscillation wavelength of a semiconductor laser source, but the output power of a harmonic (second harmonic) also can be stabilized by controlling the optimum wavelength of an optical waveguide-type QPM-SHG device. FIG. 6 shows the schematic configuration.

Figure 7:
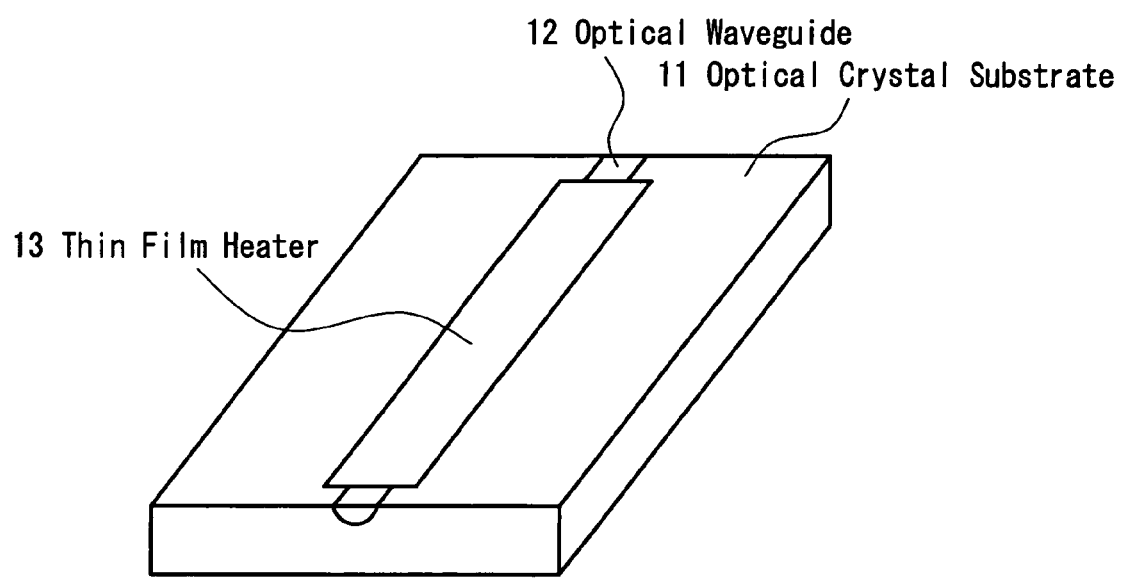
FIG. 7 is a perspective view showing how a thin film heater is installed in the third embodiment of the present invention.

As shown in FIG. 6, in the optical waveguide-type QPM-SHG device 5, a thin film heater 13 is mounted on the surface of the optical crystal substrate (X-cut MgO-doped LiNbO$_3$ substrate) 11 on the side on which the optical waveguide 12 is mounted. The thin film heater 13 is formed, for example, by vapor-depositing aluminum or the like and performing patterning using a photolithography method. As shown in FIG. 7, the thin film heater 13 is formed in a stripe shape along the optical waveguide 12, and causes a localized temperature increase at the optical waveguide portion.

Although not shown, in order to reduce a power loss of the optical waveguide 12 due to light absorption in the thin film heater 13, a buffer layer made of a dielectric film, of for example silicon dioxide, having a smaller refractive index than the material of the optical crystal substrate is provided between the optical waveguide 12 and the thin film heater 13.

When a current is applied to the thin film heater 13, the temperature of the optical waveguide portion is increased by Joule heat, causing a change in the refractive index. In this case, since the fundamental wave and the harmonic, each propagating through the optical waveguide 12, are subjected to different amounts of change in the refractive index, there occurs a difference in propagation constant between the fundamental wave and the harmonic, changing the optimum wavelength; accordingly, it is possible to let the oscillation wavelength of the semiconductor laser source 4 coincide with the optimum wavelength of the optical waveguide-type QPM-SHG device 5. It should be noted that since only heating can be performed by the thin film heater 13, a constant amount of current is applied to the thin film heater 13 in the initial emission state of the light source, and the current can be increased and decreased to provide heating and cooling effects.

When controlling the oscillation wavelength of the semiconductor laser source 4 with the currents injected into the DBR region 1 and the phase adjustment region 2 as in the method shown in the first or second embodiment, each of the currents may in some cases increase the temperature of the semiconductor laser source 4, thereby possibly reducing the emission efficiency of the semiconductor laser source 4 or shortening the life thereof. In contrast, according to a method for controlling the oscillation wavelength of the semiconductor laser source 4 by controlling the temperature of the optical waveguide-type QPM-SHG device 5 as in this embodiment, it is possible to suppress the temperature increase of the semiconductor laser source 4, thereby achieving an SHG light source having higher efficiency and longer life.

It should be noted that in this embodiment, the configuration in which the thin film heater 13 is provided on the surface of the optical waveguide-type QPM-SHG device 5 is described as an example; however, a similar effect also can be obtained by providing the thin film heater, for example, on the surface of the submount 6 at the portion directly below the optical waveguide 12. It is also possible to perform a similar wavelength control with a configuration in which the thin film heater is provided on the submount 6 at the portion on which the semiconductor laser source 4 is mounted and the temperature of the semiconductor laser source 4 is changed to fluctuate the oscillation wavelength of the semiconductor laser source 4. In this case, the possibility that the temperature increase may cause degradation in the life characteristics and emission efficiency characteristics of the semiconductor laser source 4 is greater than when the oscillation wavelength is controlled with the amounts of currents injected into the DBR region 1 and the phase adjustment region 2 of the semiconductor laser source 4, but the degree of the degradation in the life characteristics and emission efficiency characteristics is negligible because the amount of the current (and hence the current density) in each portion of the semiconductor laser source 4 is decreased.

Fourth Embodiment

The first to third embodiments described stabilization control with regard to a gradual change of the oscillation wavelength of a semiconductor laser source over time.

Figure 8:
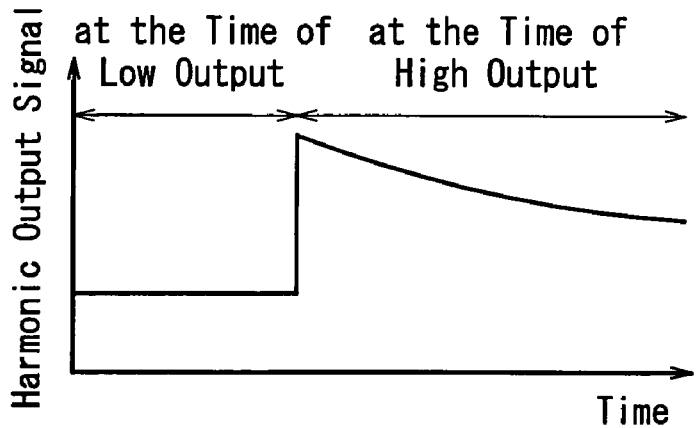
FIG. 8 is a graph conceptually showing the waveform of an output light fluctuation caused when switching between a reproducing operation and a recording operation, that is, when the average output power of the light source is switched from a low output state to a high output state in an optical disk device in a fourth embodiment of the present invention.

The present inventors found that when using a light source of the present invention in an optical disk device, there was a characteristic factor in the wavelength fluctuation caused by modulation operation employed in the optical disk device. FIG. 8 is a graph conceptually showing the waveform of an output light fluctuation caused when switching between a reproducing operation and a recording operation, that is, when the average output power of the light source is switched from a low output state to a high output state in an optical disk device.

The inventors observed the waveform of blue output when switching between recording and reproducing, and obtained an output waveform as shown in FIG. 8. That is to say, they found that a gradual decrease in output occurred after the switching, even when a high-speed modulation waveform was attained at the time of recording. The output of the semiconductor laser source was maintained constant after the switch to a high output state, so that it is believed that the decrease in the output of the harmonic is due to the change in the oscillation wavelength of the semiconductor laser source.

Figure 9:
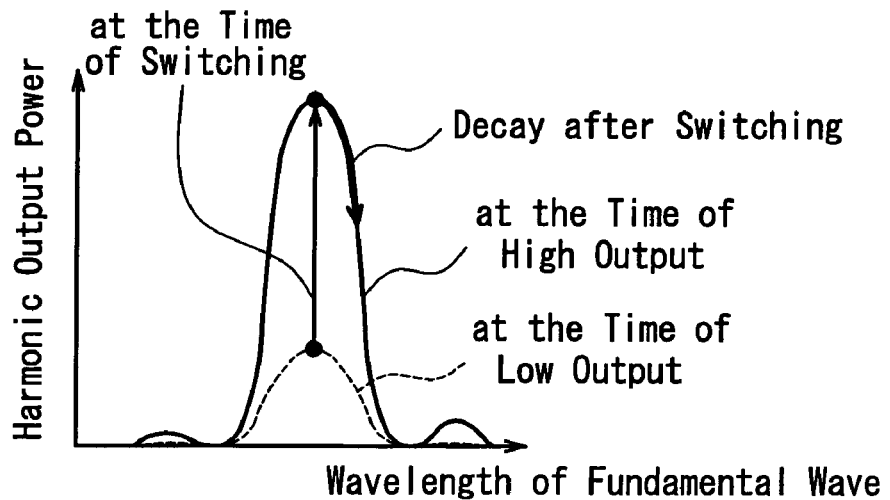
FIG. 9 is a graph conceptually showing how the output power of a harmonic and the wavelength of the fundamental wave fluctuate when switching the output power in the fourth embodiment of the present invention.

FIG. 9 is a graph conceptually showing how the output power of harmonic and the wavelength of the fundamental wave fluctuate when switching the output power. In FIG. 9, the curves indicated by the solid line and the broken line denote the dependence of the output power of the harmonic on the wavelength of the fundamental wave at the time of high output and at the time of low output, respectively. Although the emission power of the semiconductor laser source abruptly rises when switching the output power, the oscillation wavelength of the semiconductor laser source after switching gradually changes owing to the thermal behavior caused by the change in the injection current, leading to a gradual decrease in the output of the harmonic. In the following, this phenomenon is described in detail.

Figure 10:
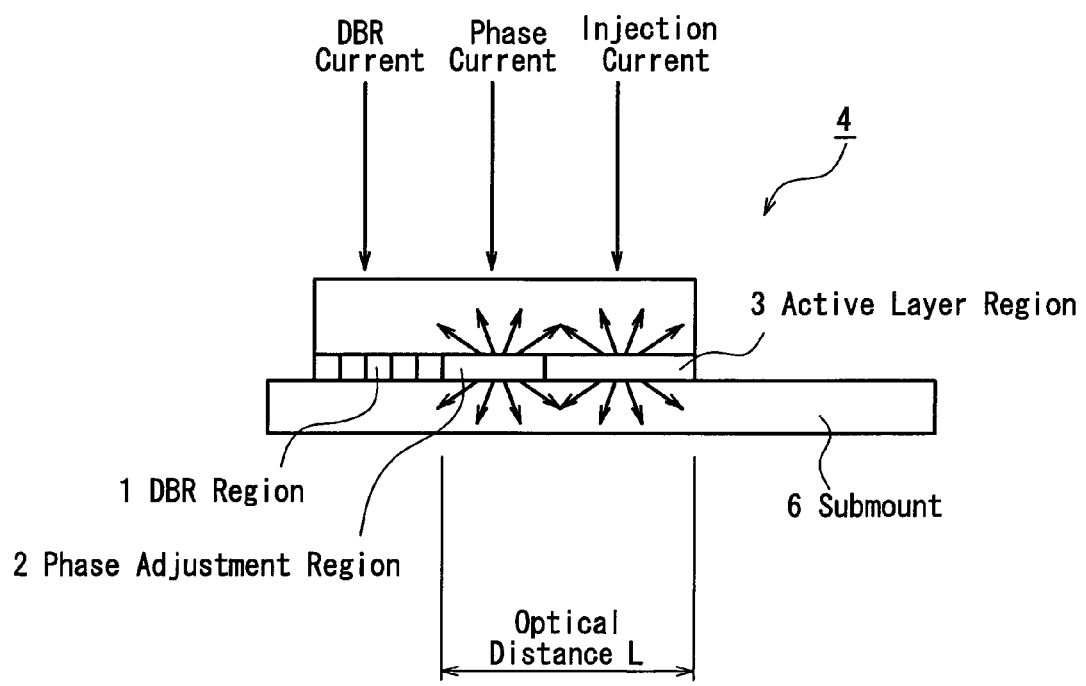
FIG. 10 is a schematic sectional view showing a semiconductor light source according to the fourth embodiment of the present invention.

FIG. 10 is a schematic sectional view showing a semiconductor laser source according to the fourth embodiment of the present invention. At the time of high-speed modulation, the temperature of the active layer region 3 changes owing to the change in the current injected into the active layer region 3, changing the effective optical distance L of the semiconductor laser source 4. In order to cope with this, the amount of heat generation in the entire semiconductor laser source 4 can be maintained substantially constant by applying to the phase adjustment region 2 a current that is complementary to the current injected (injection current) into the active layer region 3. At this time, the optical distance in the active layer region 3 and that in the phase adjustment region 2 change substantially symmetrically, so that the effective optical distance L of the semiconductor laser source 4 is maintained constant. After the recording/ reproducing switching, however, the average values of the injection currents fluctuate over a long period of time. The currents applied to the active layer region 3 and the phase adjustment region 2 not only change the temperatures of their respective regions, but also cause heat to propagate, as indicated by arrows in FIG. 10, in the thickness direction of the semiconductor laser source 4 and the direction towards the submount 6 on which the semiconductor laser source 4 is fixed, thereby changing the ambient temperature. In this case, since the phase adjustment region 2 and the active layer region 3 are arranged in different positions, they differ with regard to the temperature increase over time caused by the same current. Therefore, the change in the optical distance in each of the regions falls outside the complementary conditions, leading to the fluctuation in the oscillation wavelength of the semiconductor laser source 4 and hence the fluctuation in the output power of blue light.

Figure 11A:
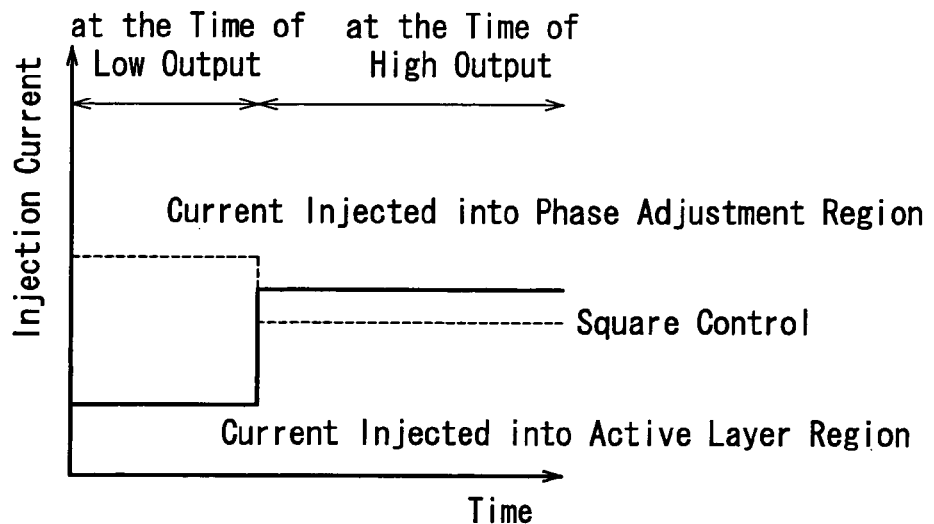
FIG. 11 is a graph showing the complementary drive waveforms when switching between recording and reproducing in the fourth embodiment of the present invention (FIG. 11A is a graph showing the temporal change of the currents injected into an active layer region and a phase adjustment region and FIG. 11B is a graph showing the change of the refractive indexes of the active layer region over time and the phase adjustment region at that time)
Figure 11B:
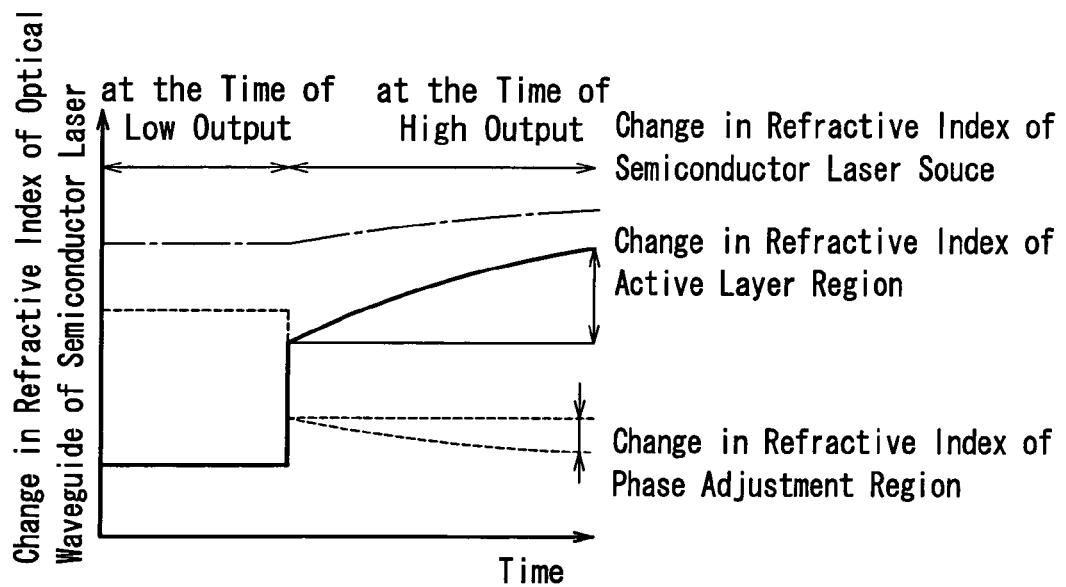

FIG. 11 shows the complementary drive waveforms at the time of the above-described recording/reproducing switching. As shown in FIG. 11A, a drive current as indicated by the solid line is applied to the active layer region 3, and a square current as indicated by the broken line is injected into the phase adjustment region 2 at the same time. At this time, as shown in FIG. 11B, the changes in the refractive indexes of the active layer region 3 and the phase adjustment region 2 are substantially symmetrical, showing complementary fluctuations. As described above, since the waveforms of the temperature fluctuation over time caused in the phase adjustment region 2 and the active layer region 3 are different, the total change in the refractive index to which the semiconductor laser source 4 is subjected shifts from a constant value, as indicated by the dash-dotted line, leading to the fluctuation in the oscillation wavelength.

Therefore, this embodiment achieves a light source device that is capable of solving the above-described problems and is a blue light source made of a wavelength-variable DBR semiconductor laser source and an optical waveguide-type QPM-SHG device, wherein a stable output light power can be obtained even after switching the average output power.

Figure 12A:
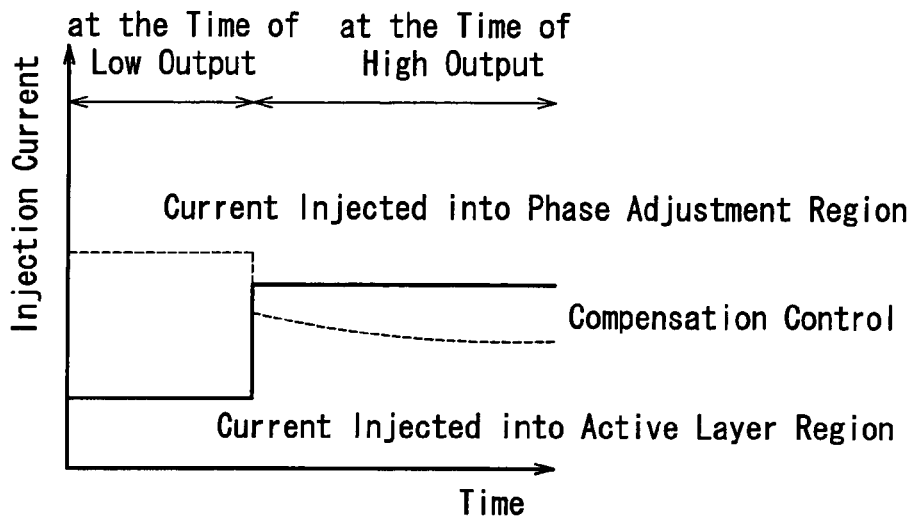
FIG. 12 is a graph showing the drive currents when switching between recording and reproducing used for suppressing the fluctuation in the output of a harmonic due to the fluctuation in an oscillation wavelength in the fourth embodiment of the present invention (FIG. 12A is a graph showing the change of the currents injected into an active layer region over time and a phase adjustment region and FIG. 12B is a graph showing the temporal change of the refractive indexes of the active layer region and the phase adjustment region at that time)
Figure 12B:
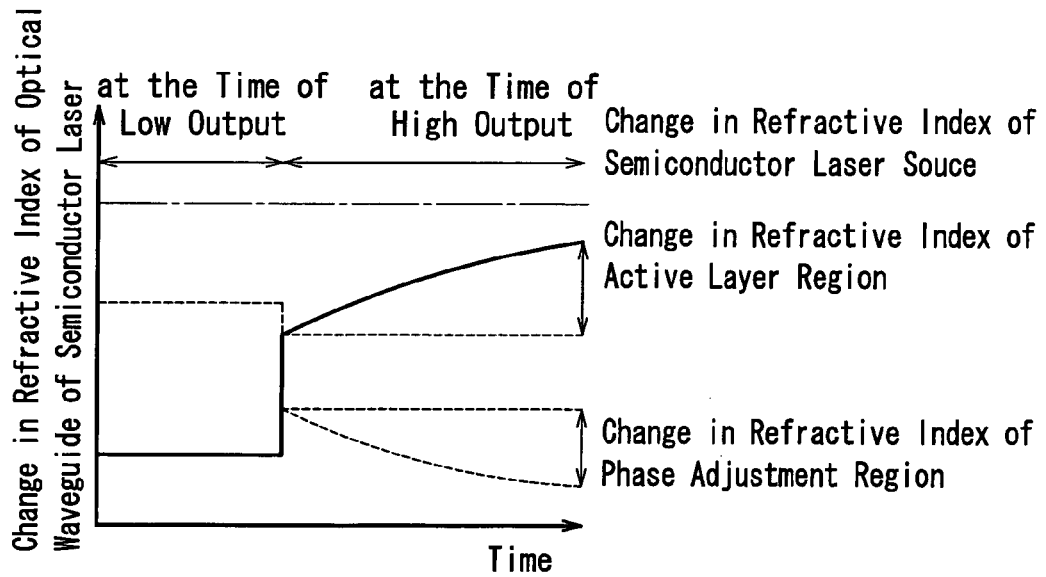

In a light source device according to this embodiment, in order to suppress the fluctuation in the output of the harmonic caused by the above-described fluctuation in the oscillation wavelength, the difference in thermal behaviors between the phase adjustment region 2 and the active layer region 3 is compensated by injecting into the phase adjustment region 2 a current that changes asymptotically, after the recording/reproducing switching, as shown in FIG. 12.

A wavelength-variable DBR semiconductor laser source and an optical waveguide-type QPM-SHG device were manufactured by way of trial, and modulation testing was performed. As a result, when the current injected into the active layer region 3 was switched from 50 mA to 150 mA, the current injected into the phase adjustment region 2 was switched from 100 mA to 45 mA and both of them were driven by a current with a square waveform, then, an asymptotic output fluctuation with a time constant of 0.15 msec and an amount of fluctuation of −12% was observed in the output of the harmonic after the switching. Therefore, like this embodiment, in addition to the current with a step-like waveform, an asymptotic change over time with an amplitude of −9 mA and a time constant of 0.15 msec was added to the current injected into the phase adjustment region 2 after the switching. Consequently, the fluctuation in the output of the harmonic was suppressed to below the measurement limit, proving that the control method of the present invention suppresses the wavelength fluctuation and thus realizes a stable light source device.

It should be noted that although in the examples shown above, the wavelength fluctuation after the switching was compensated only with the current injected into the phase adjustment region 2, the methods for controlling the wavelength of the semiconductor laser source also include a method of using the current injected into the phase adjustment region 2 and the current injected into the DBR region 1, and a similar effect also can be obtained by injecting into the phase adjustment region 2 and the DBR region 1, current with a constant ratio that shows an asymptotic temporal fluctuation. In this case, compared to the case that a current showing an asymptotic fluctuation over time is injected into only the phase adjustment region 2, it is possible to stabilize the wavelength effectively also for a semiconductor laser source that causes larger current amplitude (and hence a larger wavelength fluctuation) when switching between recording and reproducing.

Fifth Embodiment

Figure 13:
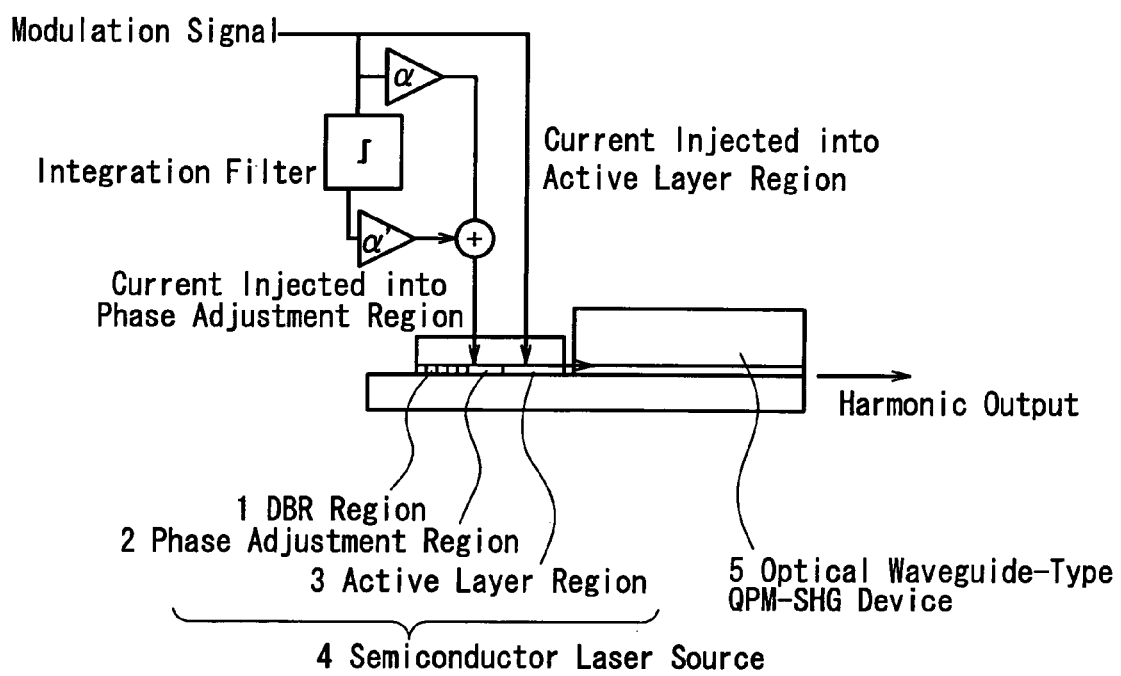
FIG. 13 is a block diagram showing a circuit configuration for providing the current injected into a phase adjustment region shown in FIG. 12 in a fifth embodiment of the present invention.

The fourth embodiment described an exemplary case in which the switching of recording/reproducing is performed merely once and each of these states continues for a long period of time. However, when a light source device of the present invention is used in an actual optical disk device, there is the possibility that the recording/reproducing switching may be repeated at random timings in a short period of time. In this case, the recording/reproducing switching is performed once again while the value of the current injected into the phase adjustment region or the phase adjustment region and the DBR region is changing asymptotically. In this case, it is effective to use a method of modulating the current injected into the phase adjustment region by using a signal obtained by passing through an appropriate filter circuit, not only the waveform of a compensation current, but also the waveform of the current injected into the active layer region. For example, in order to achieve the current injected into the phase adjustment region shown in FIG. 12, a circuit represented by a block diagram as shown in FIG. 13 is employed. More specifically, the current injected into the phase adjustment region can be approximated by the sum of a signal obtained by reversing the polarity of the waveform of the modulation signal and multiplying it by a constant α and a signal obtained by passing the waveform of the modulation signal through an integration filter. The circuit characteristics represented by the integration filter and a constant addition circuit represent the difference in thermal response characteristics between the phase adjustment region 2 and the active layer region 3, and it is possible to cause complementary temperature changes in the active layer region 3 and the phase adjustment region 2 for any arbitrary modulation signal by passing it through the filter circuit shown in FIG. 13.

Figure 14:
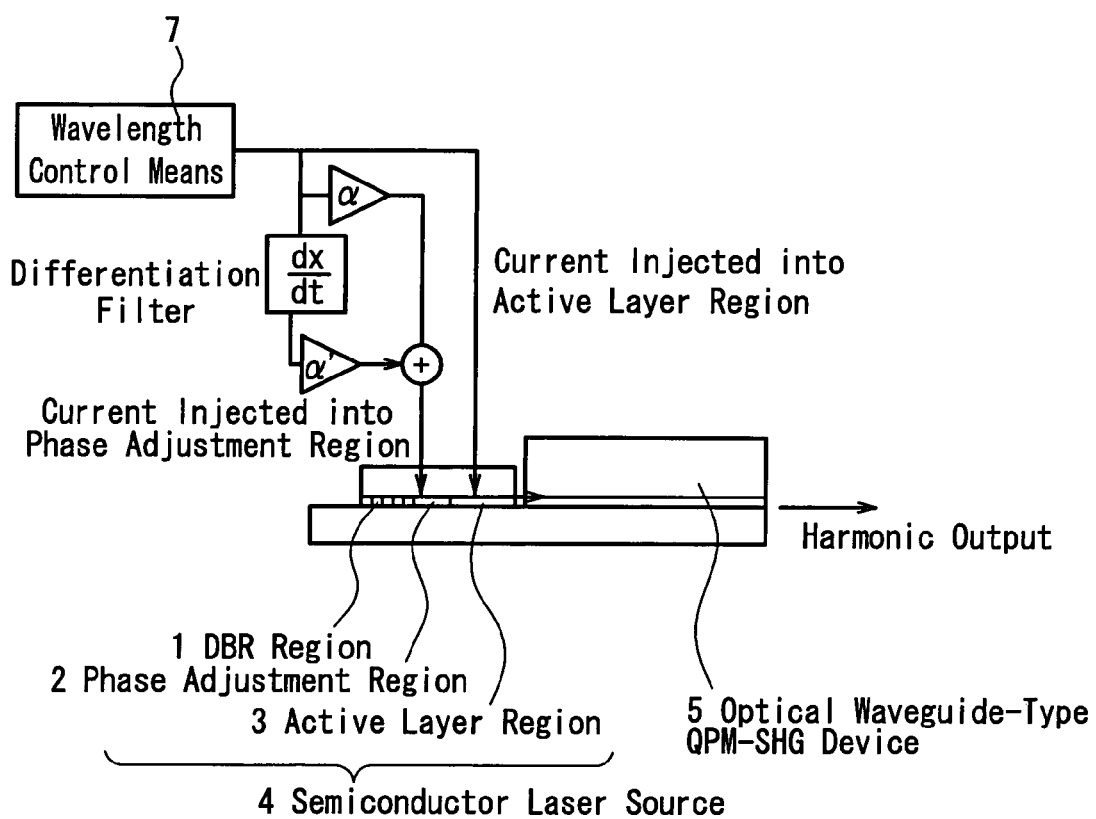
FIG. 14 is a block diagram showing another circuit configuration for achieving the current injected into the phase adjustment region shown in FIG. 12 in the fifth embodiment of the present invention.

In this embodiment, a case was shown in which the component with slow thermal response in the phase adjustment region 2 is smaller than the component with slow thermal response in the active layer region 3, that is, a case in which the difference in thermal responses can be compensated by gradually increasing the amount of a current injected into the phase adjustment region 2 after the recording/reproducing switching. However, if the semiconductor laser source has a different configuration, for example, if the semiconductor laser source is configured by reversing the positional relationship between the phase adjustment region and the active layer region, it is necessary to perform a correction opposite to that described above. That is, when the component with a slow thermal response in the phase adjustment region is larger than the component with a slow thermal response in the active layer region, it is necessary to gradually decrease the amount of a current injected into the phase adjustment region after the recording/reproducing switching. In this case, it is possible to achieve a similar stabilization of the output by using a differentiation filter in place of the integration filter, as in the block diagram shown in FIG. 14.

Sixth Embodiment

As described above, when a light source device made of a semiconductor laser source and an optical waveguide-type QPM-SHG device is modulated, the output can be stabilized by a wavelength control method of compensating a gradual temperature change or the like, and by a wavelength fluctuation compensation method of compensating the heat generated by the semiconductor laser source at the time of modulation. However, the two methods are more effective when they are simultaneously used in an appropriate combination, rather than as separate methods.

Figure 15:
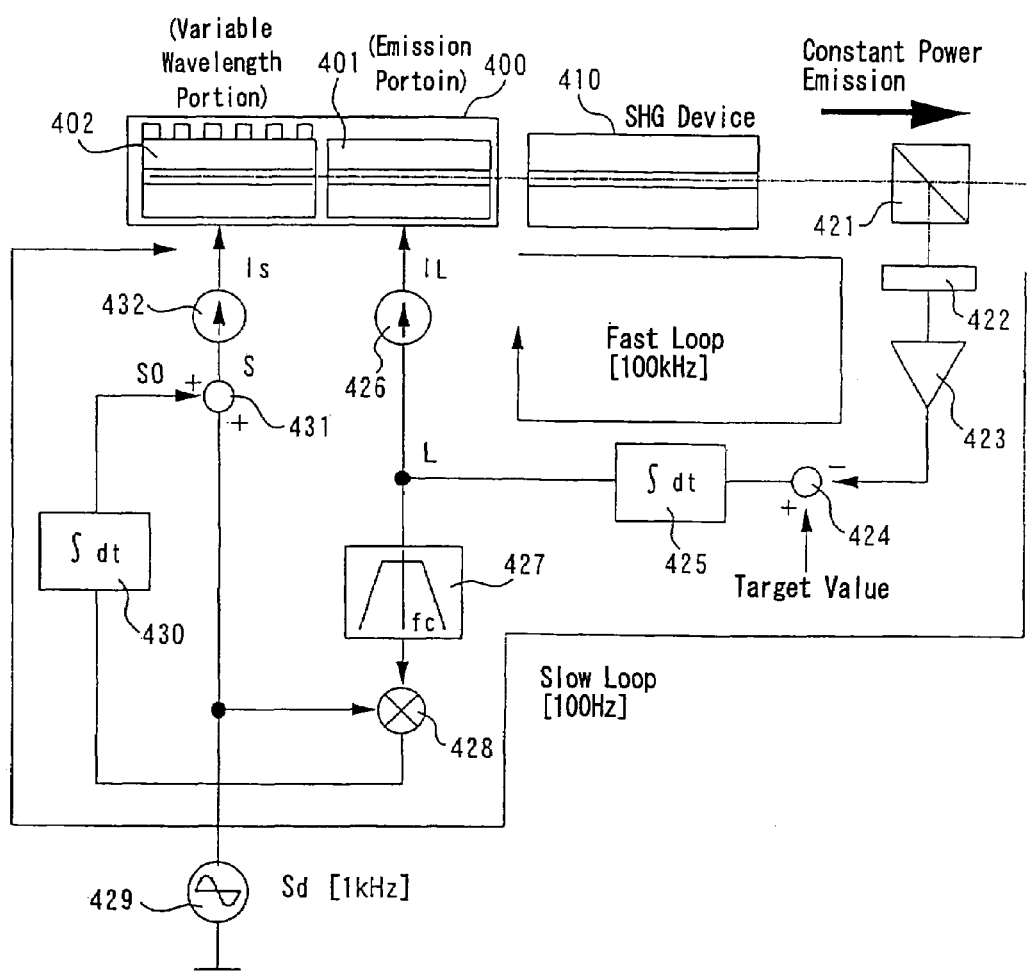
FIG. 15 is a block diagram showing the control circuit of a light source device according to a six embodiment of the present invention.

In this embodiment, a specific mode of control loops (a fast loop and a slow loop) of the emission portion and wavelength-variable portion of a wavelength-variable laser is described particularly with reference to FIGS. 15 and 16. FIG. 15 is a block diagram showing the control circuit of a light source device according to the sixth embodiment of the present invention, and FIG. 16 is a diagram showing the change over time of the current injected into the emission portion of the light source device of the sixth embodiment.

In FIG. 15, numeral 400 denotes a wavelength-variable laser, and this wavelength-variable laser 400 is made of an emission portion 401 and a wavelength-variable portion 402. Numeral 410 denotes an optical waveguide-type QPM-SHG device. A second harmonic emitted from the optical waveguide-type QPM-SHG device 410 is partly converted into an electric signal with a spectroscopic device 421 and a photodetector 422, and supplied, via a head amplifier 423, to a feedback loop (fast loop) made of a differential calculation means 424, an integration means 425, a current conversion amplifier 426 and the emission portion 401. That is, a current IL injected into the emission portion 401 is controlled such that the output signal from the head amplifier 423, which is in a constant relation with the second harmonic, coincides with the target value. It is desirable that the response frequency of this loop be set to about 100 kHz in view of its relationship with the slow loop described below.

Figure 16A:
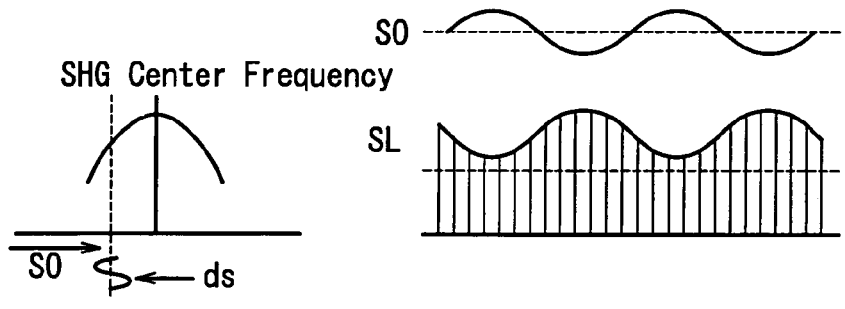
FIGS. 16A to C are diagrams showing the temporal change of the current injected into an emission portion of a light source device according to the sixth embodiment of the present invention.

In FIG. 15, the slow loop is made of the spectroscopic device 421, the photodetector 422, the head amplifier 423, the differential calculation means 424, the integration means 425, a band-pass filter 427, a multiplication means 428, a signal source 429, an integration means 430, an addition calculation means 431, a current conversion amplifier 432 and the wavelength-variable portion 402. First, a superimposed signal Sd with a predetermined frequency (about 1 kHz), supplied from the signal source 429, is converted via the current conversion amplifier 432 into a current, which is injected into the wavelength-variable portion 402. At this time, the oscillation wavelength of the wavelength-variable laser 400 changes corresponding to this signal. When the oscillation wavelength changes, then the conversion efficiency of the optical waveguide-type QPM-SHG device 410 changes in accordance with the relation with the wavelength of the maximum efficiency conversion that is specific to the optical waveguide-type QPM-SHG device 410. If the "fast feedback loop" is not in operation, this change in the conversion efficiency will be directly apparent as the change in the output of the second harmonic. However, the response frequency of the fast feedback loop is 100 kHz, which is sufficiently higher than the frequency of this change (about 1 kHz), and the decrease in the output of the second harmonic caused by the decrease in the conversion efficiency is immediately fed back as the increase in the current IL injected into the emission portion 401, so that a change in the output of the second harmonic is hardly observed (suppressed to about 1/100 in this embodiment). However, a feedback signal SL of the feedback current IL injected into the emission portion 401 changes, as shown in FIGS. 16A, B and C, corresponding to the conversion efficiency of the optical waveguide-type QPM-SHG device 410. That is, the feedback signal SL (feedback current IL) is generated so as to cancel the change in the conversion efficiency in the wavelength-variable portion 402 that occurs due to the superimposed disturbance current.

Figure 16B:
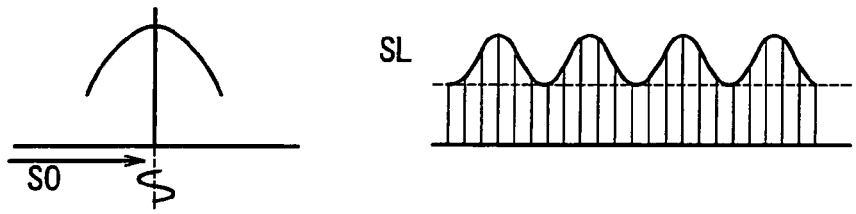
Figure 16C:
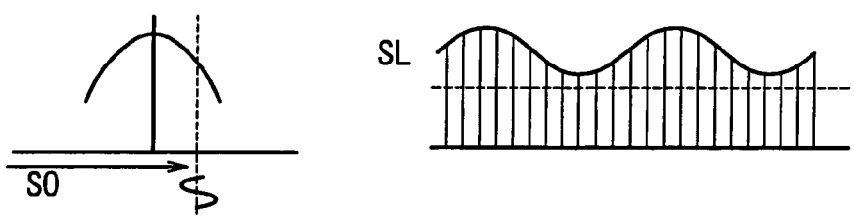

Here, when the central value of the current injected into the wavelength-variable portion 402 is taken as S0, the feedback signal SL changes to be in phase (FIG. 16C) or in anti-phase (FIG. 16A) with the signal Sd superimposed thereon, depending on the relation between this central value S0 and the wavelength of the maximum efficiency conversion (SHG central wavelength) that is specific to the optical waveguide-type QPM-SHG device 410. When S0 coincides with the SHG center frequency, the fundamental frequency component (1 kHz) of the Sd disappears and only a double frequency component remains, as shown in FIG. 16B. Accordingly, by configuring a loop that integrates this wobbling signal Sd and the feedback signal SL, which has passed through the band-pass filter 427, and supplies the integration over time as the feedback value S0 to the wavelength-variable portion 402, it is possible to operate the wavelength-variable laser 400 constantly at a wavelength in the vicinity of the maximum efficiency conversion of the optical waveguide-type QPM-SHG device 410.

For reference, the operation of the slow loop is described using equations. First, a sine wave of the signal Sd generated by the signal source 429 is given by the following Equation 3, and a current Is supplied to the wavelength-variable portion 402 is normalized using the following Equation 4.

$$Sd = a\sin(\omega t) \quad \text{(Equation 3)}$$

(a: constant)

$$S = Sd + S0 \quad \text{(Equation 4)}$$

Here, provided that the feedback signal SL (which depends on the conversion efficiency of the optical waveguide-type QPM-SHG device 410) for a wavelength-variable current S (Is) is approximated by the following Equation 5, the relationship given by the following Equation 6 is obtained by substituting the above Equation 4 into the following Equation 5.

$$SL = -b(S - Sx)^2 + c \quad \text{(Equation 5)}$$

(b, c: constants)

$$SL = -b(S0 + Sd - Sx)^2 + c \quad \text{(Equation 6)}$$
$$= -b\{S0 - Sx + a\sin(\omega t)\}^2 + c$$

In the above Equation 6, Sx is unknown and is a solution obtained by the following probe.

The product of the above feedback signal SL and the source signal Sd is calculated by the multiplication means 428. That is, the calculation of the following Equation 7 is performed.

$$SL \times a\sin(\omega t) = (ab(S0 - Sx)^2 + c)\sin\theta + \quad \text{(Equation 7)}$$
$$2a^2b(S0 - Sx)\sin 2\theta +$$
$$a^3 b \sin 3\theta$$

($\theta = \omega t$)

When integrating the output signal of this product with the integration means 430, since sin$\theta$ and sin3$\theta$ are odd functions, their integral is 0. Accordingly, when only the second term is calculated, the following Equation 8 is given, and a signal that is linearly proportional to the central value S0 of the injection current is obtained.

$$\int (SL \times a\sin\theta) d\theta = 2a^2 b(S0 - Sx) \int \sin 2\theta d\theta \quad \text{(Equation 8)}$$
$$= 2\pi a^2 b(S0 - Sx)$$

Accordingly, when a feedback loop in which this multiplication signal is 0 is formed, then it is inevitable that S0=Sx, so that the optimum current is constantly supplied to the wavelength-variable portion 402.

It should be noted that when the frequency of the disturbance signal supplied from the signal source 429 is 1 kHz, it is desirable that the operating frequency of the slow feedback loop be about one-tenth of that, i.e., about 100 Hz.

Seventh Embodiment

Figure 17:
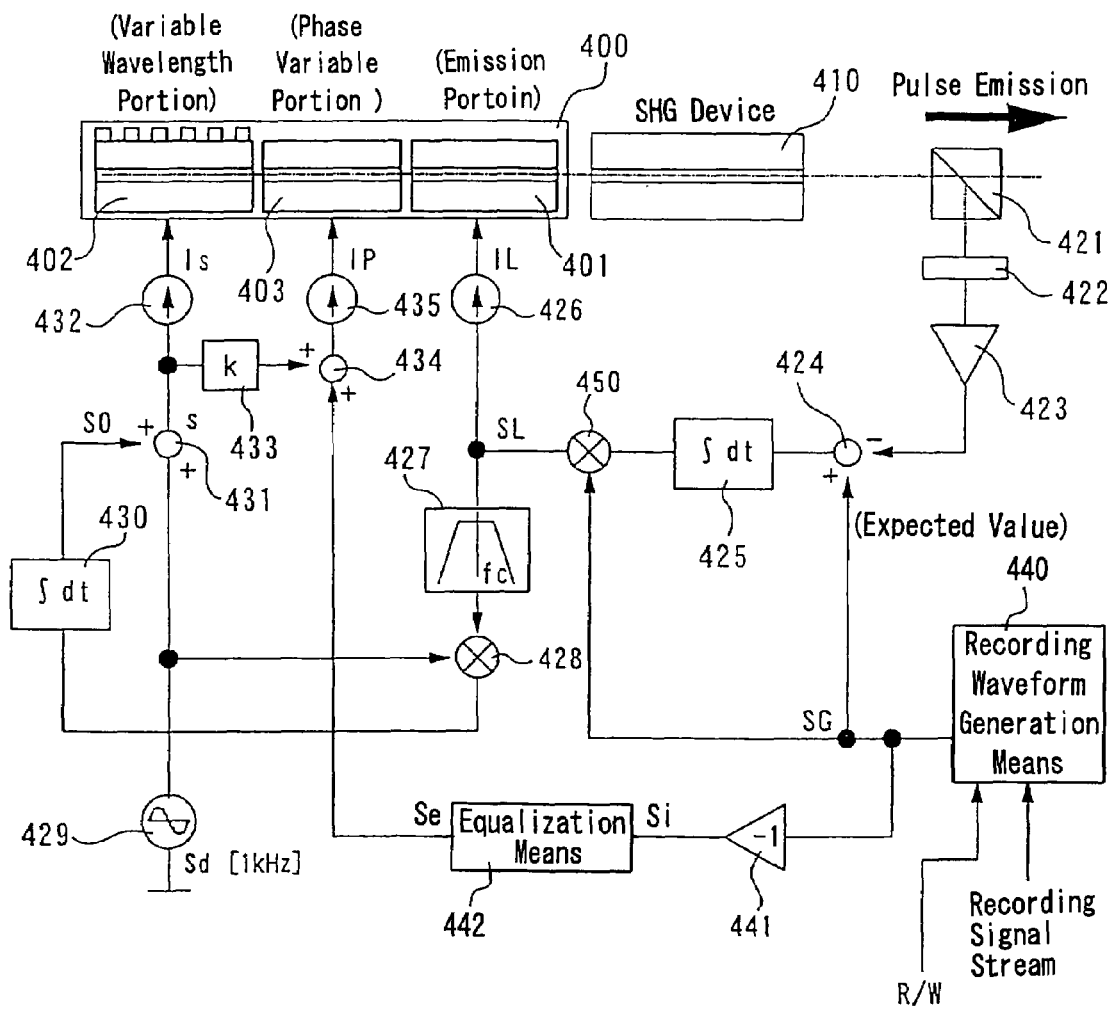
FIG. 17 is a block diagram showing the control circuit of a light source device according to a seventh embodiment of the present invention.

FIG. 17 is a block diagram showing the control circuit of a light source device according to a seventh embodiment of the present invention. In FIG. 17, numeral 400 denotes the wavelength-variable laser, and this wavelength-variable laser 400 is made of the emission portion 401, the wavelength-variable portion 402 and a phase-variable portion 403. Additionally, the emission portion 401 of the wavelength-variable laser 400, the spectroscopic device 421, the photodetector 422, the head amplifier 423, the differential calculation means 424, the integration means 425 and the current conversion amplifier 426 constitute a so-called fast feedback loop that corrects the fluctuating portion of the output of the second harmonic by controlling the current injected into the emission portion 401. Further, the spectroscopic device 421, the photodetector 422, the head amplifier 423, the differential calculation means 424, the integration means 425, the band-pass filter 427, the multiplication means 428, the signal source 429, the integration means 430, the addition calculation means 431, current conversion amplifiers 432 and 435, a coefficient multiplier 433 and the wavelength-variable portion 402 constitute a so-called slow loop that constantly probes the maximum point of the conversion efficiency of the optical waveguide-type QPM-SHG device 410. The above-described fast loop and slow loop have equal functions to the fast loop and slow loop in the sixth embodiment. The feature of this embodiment lies in the provision of structural elements for outputting a desired output and a second harmonic of the modulation waveform when recording signals. This is described in the following.

Figure 18:
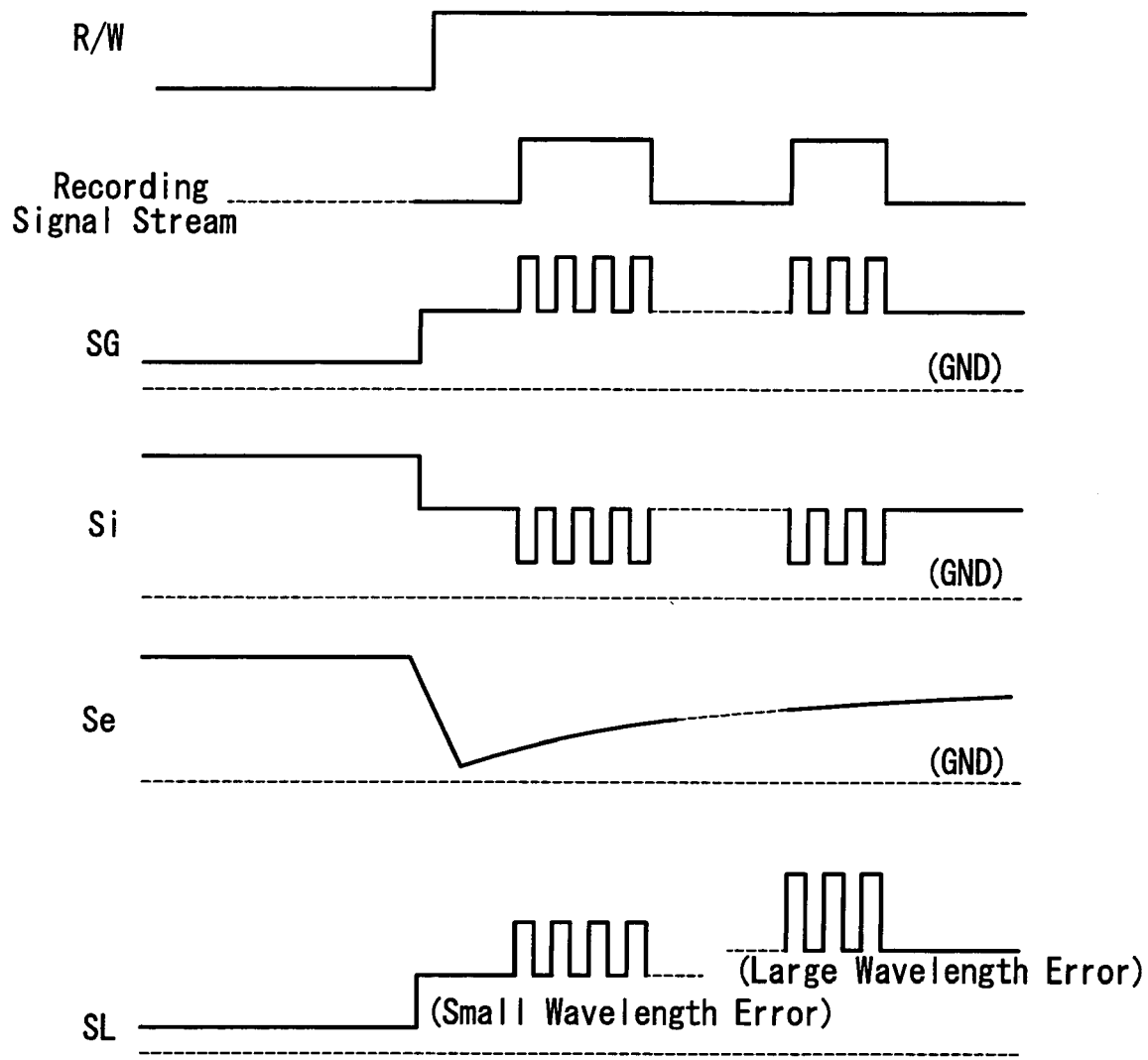
FIG. 18 is a diagram showing the waveforms of signals used in the seventh embodiment of the present invention.

First, after switching from a reproducing mode to a recording mode (R/W→H), a recording waveform generation means 440 generates a recording signal SG corresponding to a recording signal stream. The recording signal SG shown in FIG. 18 is given based on the assumption that the recording medium is a phase change medium. That is, when the information "1" is recorded, a pulse train with the maximum power is output for the formation of an amorphous mark on the phase change medium, whereas when the information "0" is recorded (when information is erased), a constant value with a medium power is output that is supposed to locally crystallize the phase change medium. This recording signal SG is superimposed, via a modulator 450, on the current IL injected into the emission portion 401, and (after being converted with the optical waveguide-type QPM-SHG device 410) projected as modulated light onto the recording medium. While the target value of the fast loop at this time may be a value corresponding to the desired average power of the modulated light, the modulation signal (recording signal) SG generated by the recording waveform generation means 440 also may be used directly as the target value (the "expected value").

The modulation signal (recording signal) SG is further supplied, via an inversion means 441 and an equalization means 442, to the phase-variable portion 403 of the wavelength-variable laser 400. This is described in the following. Although in the sixth embodiment the oscillation wavelength was changed only with the amount of a current injected into the wavelength-variable portion 402 of the wavelength-variable laser 400, an actual wavelength-variable laser 400 is provided with the phase-variable portion 403 for phase matching, in order to avoid mode hopping when the wavelength is changed. That is, at the same time when the current Is is injected into the wavelength-variable portion 402, a current Ip that is a constant (k) multiple of this current is injected into the phase-variable portion 403. The phase-variable portion 403 is actually a so-called heater, which serves to change the refractive index of the waveguide of the laser by using the heat generated by the injection current.

Here, when the reproducing operation is switched to the recording operation, the current injected into the emission portion 401 is inevitably increased in order to increase the power of the laser, and the temperature of the emission portion 401 is increased by the heat generated at this time. Since the emission portion 401 also has a waveguide structure, the change in the refractive index due to the generated heat causes the shifting of the phase as well as of the wavelength. This results in a decrease in the conversion efficiency of the optical waveguide-type QPM-SHG device 410 and the occurrence of mode hopping. To prevent this, a current that is substantially in anti-phase with the one injected into the emission portion 401 is supplied, via the addition calculation means 434, to the phase-variable portion 403 in this embodiment. More specifically, an inverted waveform Si (FIG. 17) is first generated with the inversion means 441, and the compensation value Se thus obtained is converted into a current with the equalization means 442. Consequently, the current injected into the emission portion 401 is increased, while the current injected into the phase-variable portion (heater) 403 is decreased, so that the overall amount of heat that is generated is maintained constant during both recording and reproducing.

Figure 19:
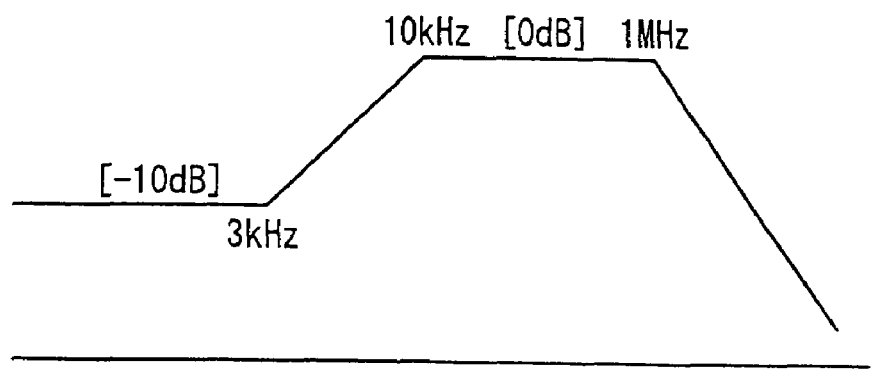
FIG. 19 is a conceptual diagram showing a band-pass filter used as an equalization means in the seventh embodiment of the present invention.
Figure 20:
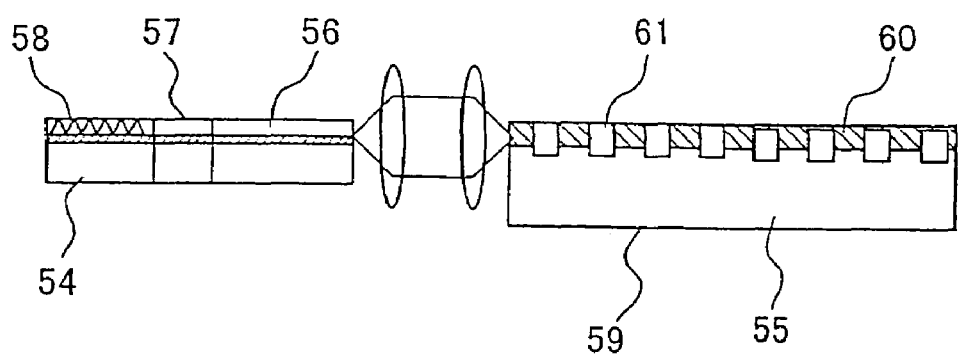
FIG. 20 is a diagram showing the configuration of an SHG blue light source using an optical waveguide-type QPM-SHG device according to the prior art.

However, the experiments carried out by the present inventors have proved that overcorrection occurs when the inverted waveform Si is supplied continuously directly to the phase-variable portion 403. This is believed to be related to the propagation and accumulation of heat inside the laser. Therefore, the inventors investigated converting the inverted waveform Si into a waveform (Se) as shown in FIG. 18 using the equalization means 442, that is, a waveform where the amount of correction is set to a maximum immediately after changing the power, and then gradually decreased by about 10% per 100 $\mu$s. It was found that this allowed thermal correction to be performed effectively. Specifically, the equalization means 442 can be embodied by using a band-pass filter as shown in FIG. 19, for example.

In addition, the thermal correction means made of the inversion means 441, the equalization means 442 and the like is a so-called open-loop, whose precision of correction is limited. In other words, there is a minor thermal correction residual. This results in the occurrence of a minor shift of the wavelength, which however is followed up by the fast feedback loop at 100 kHz, that is, with a response of about 10 $\mu$s, so that the output of the second harmonic itself is not affected. Here, since the decrease in the conversion efficiency of the optical waveguide-type QPM-SHG device 410 due to the wavelength shift is compensated by the emission power of the source oscillation, the fast feedback control is performed, resulting in some temporary increase in the current IL injected into the emission portion 401; however, the slow loop eventually probes the maximum efficiency.

As described above, according to this embodiment, thermal equalization and compensation means, a fast loop and a slow loop are successively employed, thereby making it possible to effectively absorb the fluctuation in a second harmonic caused by the wavelength shift when switching the power from reproduction to recording.

Additionally, the sixth and seventh embodiments described the operation after each of the feedback loops started to operate (the so-called "pull-in"); however, the following problems occur if both of the feedback loops are operated simultaneously before the pull-in. Ordinarily, in order for a target value and a variable to be pulled in stably to the operation point of a feedback loop, they need to be in a predetermined range (capture range) immediately before the pull-in. As described above, the wavelength dependence of the optical waveguide-type QPM-SHG device is usually conspicuous, and the conversion efficiency of the optical waveguide-type QPM-SHG device is substantially zero when there is a large error, for example, a shift of about 1 nm, between the oscillation wavelength of the laser and the SHG central wavelength. Accordingly, no second harmonic is generated, and the amount of light detected by a light-receiving device is also zero. If the fast feedback loop is operated at this time, the current injected into the emission portion of the wavelength-variable laser is increased without limit in order to make the amount of the received light to be the predetermined target value. Then, if this state is allowed to continue, the laser inevitably will be damaged.

Therefore, before the pull-in, it is necessary either to suspend the function of the fast feedback loop or reduce the response speed to an extremely low level. For example, a sequence should be configured such that a constant current is passed through the emission portion of the wavelength-variable laser before the pull-in and the fast feedback loop is operated (closed) after the slow feedback loop has caused the wavelength of the laser to reach the vicinity of the wavelength of the maximum efficiency. Additionally, it is desirable that the amplitude of the disturbance signal in the slow feedback loop be set larger than in the normal state, in order to broaden the capture range. For example, if the amplitude of the disturbance signal in the normal state is 0.1 nm in terms of wavelength, it is desirable that the amplitude be set to about 1 nm at the time of the pull-in. The reason is that the error between the oscillation wavelength of the wavelength-variable laser and the SHG central wavelength is substantially within the range of 1 nm in a default state.

INDUSTRIAL APPLICABILITY

As described above, the present invention can achieve a stable output of a harmonic even if there occurs a change in the ambient temperature or fluctuation in the output power, so that it can be utilized for compact short-wavelength light sources used for realizing high density for optical disks and high resolution for displays.

The invention claimed is:

1. A light source device comprising:
   a semiconductor laser source;
   a second harmonic generation device for generating a second harmonic from light emitted from the semiconductor laser source;
   a means for controlling output light power of the semiconductor laser source in such a manner that a power of the second harmonic emitted from the second harmonic generation device is constant;
   a means for controlling a wavelength of light emitted from the semiconductor laser source;
   a means for periodically changing the wavelength of light emitted from the semiconductor laser source; and
   a means for detecting a change in output light power of the semiconductor laser source or a change in an amount of a current injected into the semiconductor laser source that occurs when the wavelength of light emitted from the semiconductor laser source is periodically changed,
   wherein the wavelength of light emitted from the semiconductor laser source is controlled to an optimum wavelength of the second harmonic generation device based on the change in output light power of the semiconductor laser source or the change in the amount of the current injected into the semiconductor laser source that occurs when the wavelength of light emitted from the semiconductor laser source is periodically changed.

2. The light source device according to claim 1, wherein the semiconductor laser source is a distributed Bragg reflector (DBR) semiconductor laser source having a DBR region.

3. The light source device according to claim 2, wherein the semiconductor laser source has a phase adjustment region.

4. The light source device according to claim 3, wherein the wavelength of light emitted from the semiconductor laser source is changed by changing the amount of the current injected into the phase adjustment region of the semiconductor laser source.

5. The light source device according to claim 3, wherein the wavelength of light emitted from the semiconductor laser source is changed by changing, at a constant ratio, an amount of a current injected into the phase control region and an amount of a current injected into an active layer region of the semiconductor laser source.

6. The light source device according to claim 1, wherein a heater is provided in the vicinity of the semiconductor laser source, and the wavelength of light emitted from the semiconductor laser source is changed by changing an amount of heat applied by the heater.

7. An optical information recording/reproducing apparatus comprising: the light source device according to claim 1;
   a condensing optical system for guiding light from the light source device to an information carrier; and
   a means for detecting light reflected from the information carrier.

8. A light source device comprising:
   a semiconductor laser source;
   a second harmonic generation device for generating a second harmonic from light emitted from the semiconductor laser source;
   a means for controlling output light power of the semiconductor laser source in such a manner that a power of the second harmonic emitted from the second harmonic generation device is constant;
   a means for controlling an optimum wavelength of the second harmonic generation device;
   a means for periodically changing a wavelength of light emitted from the semiconductor laser source; and
   a means for detecting a change in output light power of the semiconductor laser source or a change in an amount of a current injected into the semiconductor laser source that occurs when the wavelength of light emitted from the semiconductor laser source is periodically changed,
   wherein a wavelength of the second harmonic generation device is controlled to the optimum wavelength based on the change in output light power of the semiconductor laser source or the change in the amount of the current injected into the semiconductor laser source that occurs when the wavelength of the semiconductor laser source is periodically changed.

9. The light source device according to claim 8, wherein the semiconductor laser source is a distributed Bragg reflector (DBR) semiconductor laser source having a DBR region.

10. The light source device according to claim 9, wherein the semiconductor laser source has a phase adjustment region.

11. The light source device according to claim 10, wherein the wavelength of light emitted from the semiconductor laser source is changed by changing the amount of the current injected into the phase adjustment region of the semiconductor laser source.

12. The light source device according to claim 10, wherein the wavelength of light emitted from the semiconductor laser source is changed by changing, at a constant ratio, an amount of a current injected into the phase control region and an amount of a current injected into an active layer region of the semiconductor laser source.

13. The light source device according to claim 8, wherein a heater is provided in the vicinity of the semiconductor laser source, and the wavelength of light emitted from the semiconductor laser source is changed by changing an amount of heat applied by the heater.

14. The light source device according to claim 8, wherein a heater is provided in the vicinity of an optical waveguide of the second harmonic generation device.

15. An optical information recording/reproducing apparatus comprising: the light source device according to claim 8;
   a condensing optical system for guiding light from the light source device to an information carrier; and
   a means for detecting light reflected from the information carrier.

* * * * *